US012648164B2

(12) United States Patent
Lu et al.

(10) Patent No.: US 12,648,164 B2
(45) Date of Patent: Jun. 2, 2026

(54) SEMICONDUCTOR STRUCTURE AND METHOD FOR MANUFACTURING THE SAME

(71) Applicant: Taiwan Semiconductor Manufacturing Company, Ltd., Hsinchu (TW)

(72) Inventors: Chun-Fu Lu, Hsinchu (TW); Chih-Hao Wang, Baoshan Township, Hsinchu County (TW); Wang-Chun Huang, Kaohsiung (TW); Kuo-Cheng Chiang, Zhubei City (TW); Mao-Lin Huang, Hsinchu City (TW); Jia-Ni Yu, New Taipei City (TW); Lung-Kun Chu, New Taipei City (TW); Chung-Wei Hsu, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 449 days.

(21) Appl. No.: 18/188,964

(22) Filed: Mar. 23, 2023

(65) Prior Publication Data

US 2024/0322013 A1 Sep. 26, 2024

(51) Int. Cl.
*H10D 30/01* (2025.01)
*H10D 30/63* (2025.01)
(Continued)

(52) U.S. Cl.
CPC ....... *H10D 30/025* (2025.01); *H10D 30/0415* (2025.01); *H10D 30/63* (2025.01);
(Continued)

(58) Field of Classification Search
CPC ..... H10D 62/121; H10D 64/017; H10D 84/83
See application file for complete search history.

(56) References Cited

U.S. PATENT DOCUMENTS 8,823,065 B2 9/2014 Wang et al.
9,105,490 B2 8/2015 Wang et al.
(Continued)

OTHER PUBLICATIONS

U.S. Notice of Allowance for U.S. Appl. No. 18/173,491, dated Sep. 19, 2025.
(Continued)

*Primary Examiner* — Fernando L Toledo
*Assistant Examiner* — Adam S Bowen
(74) *Attorney, Agent, or Firm* — Birch, Stewart, Kolasch & Birch, LLP

(57) ABSTRACT

A method for manufacturing a semiconductor structure includes forming first and second channel layers over a substrate, forming first source/drain features over the first and second channel layers, forming a gate dielectric layer wrapping around the first and second channel layers, forming a first work function layer wrapping around the gate dielectric layer, forming a hard mask layer wrapping around the first work function layer, removing portions of the hard mask layer and the first work function layer, removing the hard mask layer and the first work function layer wrapping around the second channel layer, removing the hard mask layer wrapping around the first channel layer, forming a second work function layer wrapping around the first work function layer and the second channel layer, forming a metal material between the second work function layer, and forming second source/drain features under the first and second channel layers.

20 Claims, 22 Drawing Sheets

(51) Int. Cl.

| | |
|---|---|
| *H10D 30/69* | (2025.01) |
| *H10D 64/01* | (2025.01) |
| *H10D 64/66* | (2025.01) |
| *H10D 64/68* | (2025.01) |
| *H10D 84/01* | (2025.01) |
| *H10D 84/03* | (2025.01) |
| *H10D 84/85* | (2025.01) |

(52) U.S. Cl.

CPC ......... *H10D 30/701* (2025.01); *H10D 64/018* (2025.01); *H10D 64/667* (2025.01); *H10D 64/689* (2025.01); *H10D 84/017* (2025.01); *H10D 84/0177* (2025.01); *H10D 84/0181* (2025.01); *H10D 84/0188* (2025.01); *H10D 84/0195* (2025.01); *H10D 84/038* (2025.01); *H10D 84/85* (2025.01)

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,502,183 | B2 | 11/2022 | Yao et al. |
| 2017/0110554 | A1 | 4/2017 | Tak et al. |
| 2019/0123163 | A1 | 4/2019 | Yang et al. |
| 2019/0386136 | A1* | 12/2019 | Kwon ................. H10D 84/016 |
| 2020/0227570 | A1 | 7/2020 | Chen et al. |
| 2020/0350313 | A1* | 11/2020 | Xie ...................... H10D 30/025 |
| 2021/0013106 | A1* | 1/2021 | Xie ...................... H10D 30/025 |
| 2021/0313449 | A1 | 10/2021 | Lin et al. |
| 2022/0102492 | A1 | 3/2022 | Gardner et al. |
| 2022/0367623 | A1 | 11/2022 | Lee et al. |

OTHER PUBLICATIONS

U.S. Office Action for U.S. Appl. No. 18/173,491, dated Apr. 20, 2026.

* cited by examiner

SEMICONDUCTOR STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins.

However, although existing technologies for GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
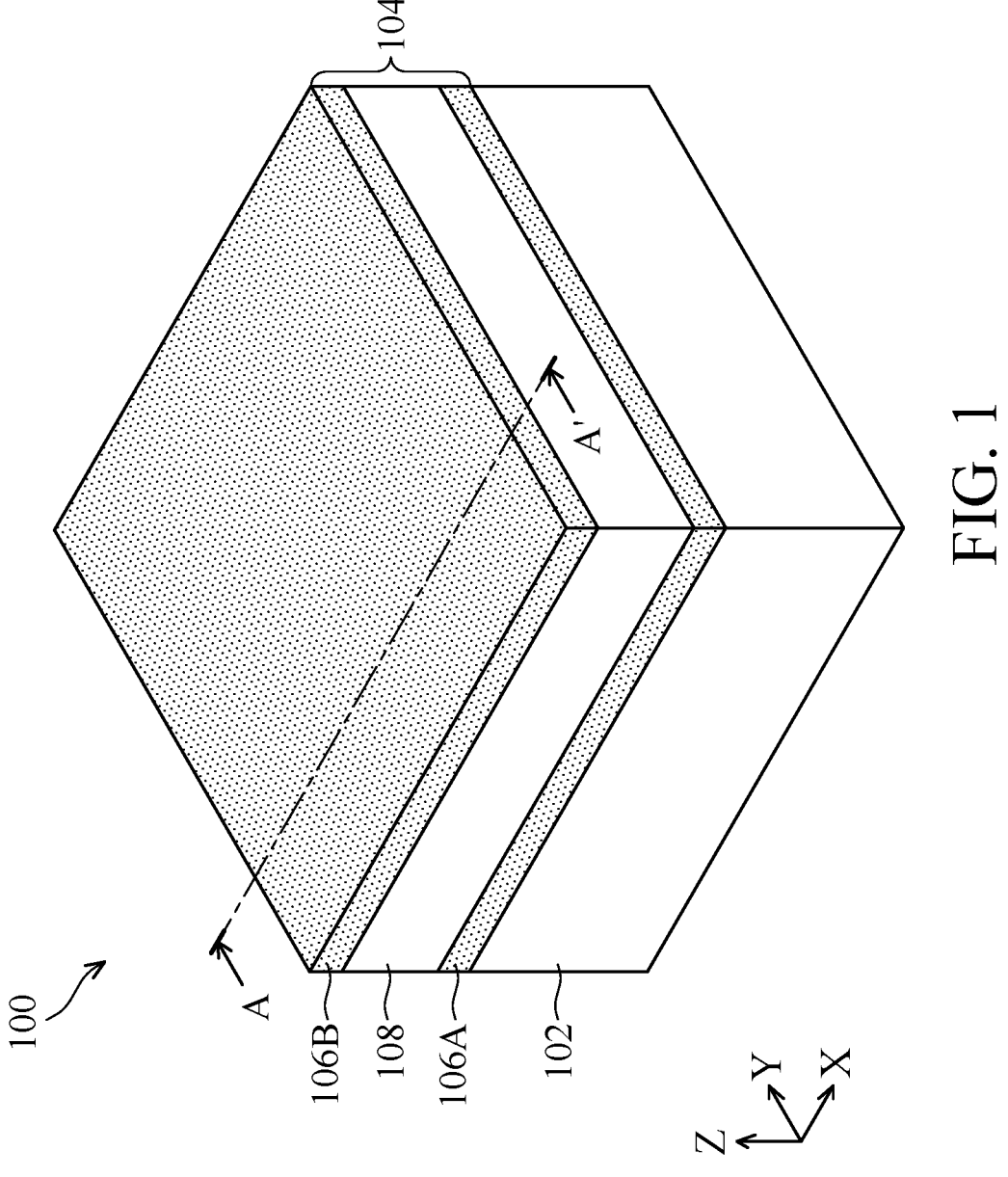
FIG. 1 is perspective views of a workpiece at various fabrication stages, in accordance with some embodiments of the present disclosure.
Figure 2:
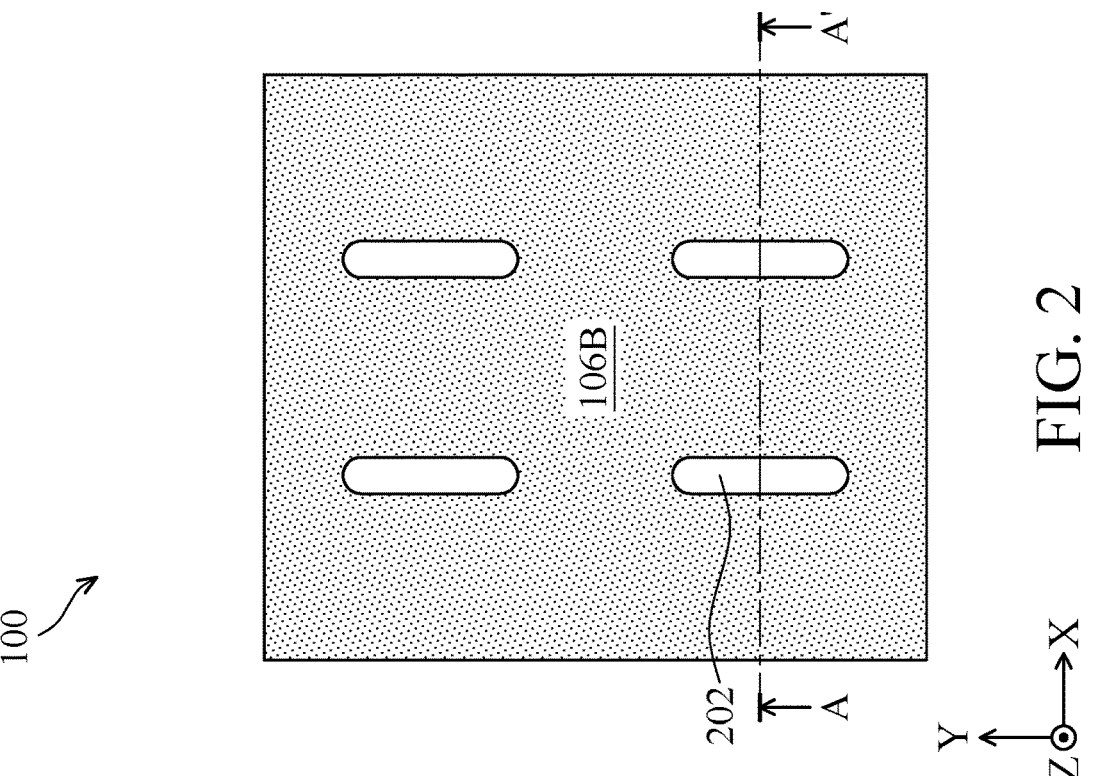
FIG. 2 is a top view of the workpiece at a fabrication stage of FIG. 1, in accordance with some embodiments of the present disclosure.

FIGS. 31A, 31B, 31C, 31D, 31E, and 31F are X-Z cross-sectional views of the workpiece 100 at various fabrication stages for forming the dipole layers along lines A-A' of FIGS. 1 and 2, in accordance with some embodiments of the present disclosure.

Figures 26, 27:
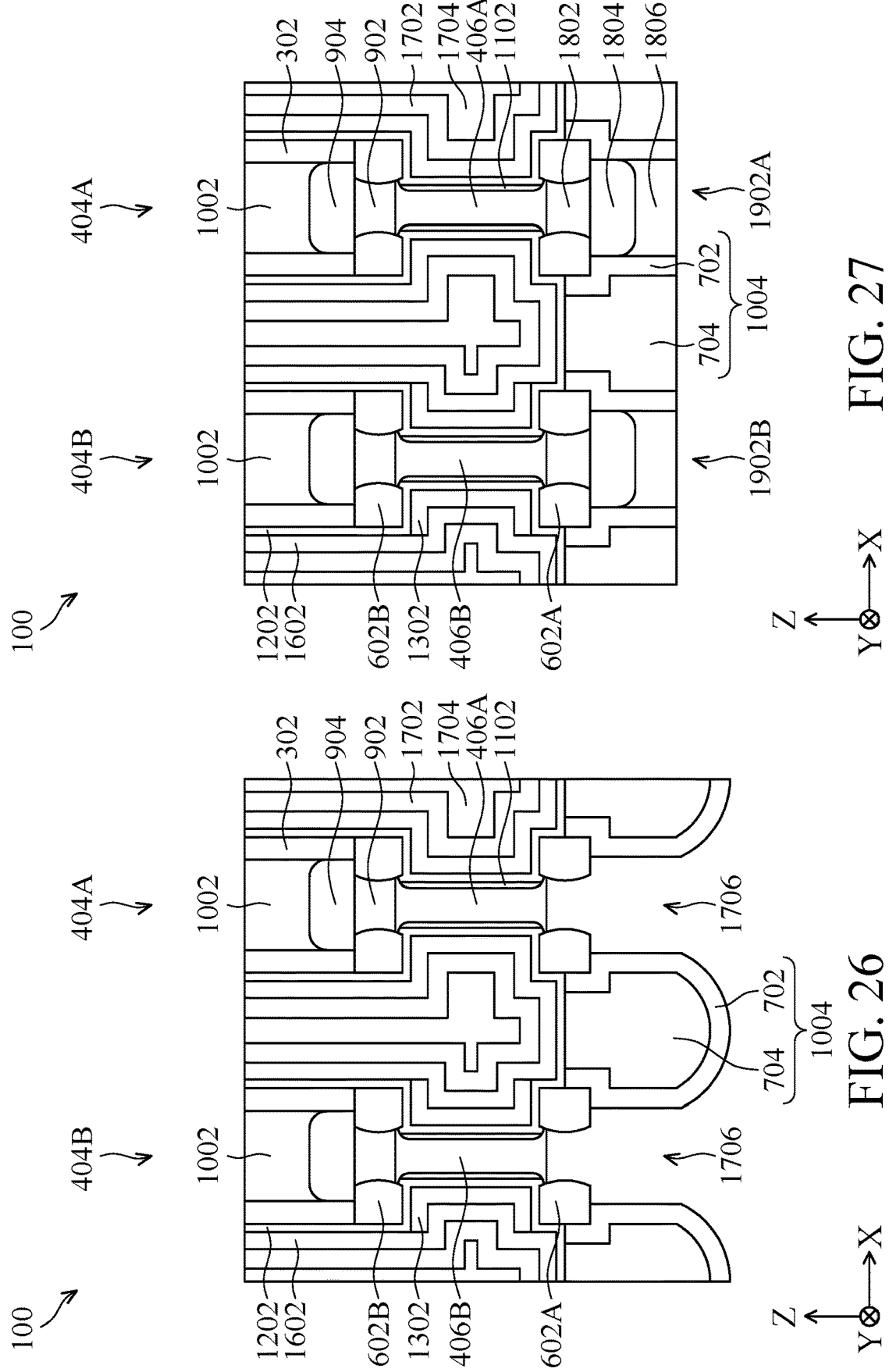
Figure 28:
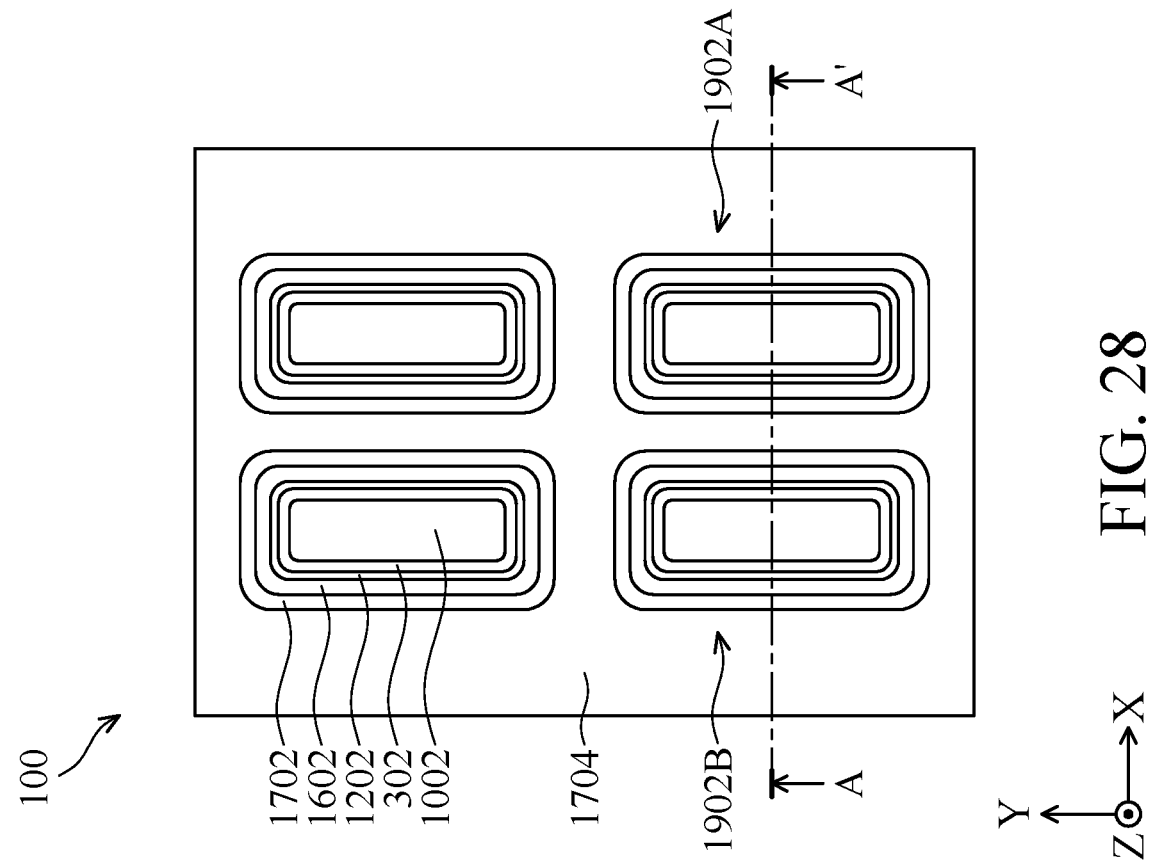
FIG. 28 is a top view of the workpiece at a fabrication stage, in accordance with some embodiments of the present disclosure.
Figures 32A, 32B:
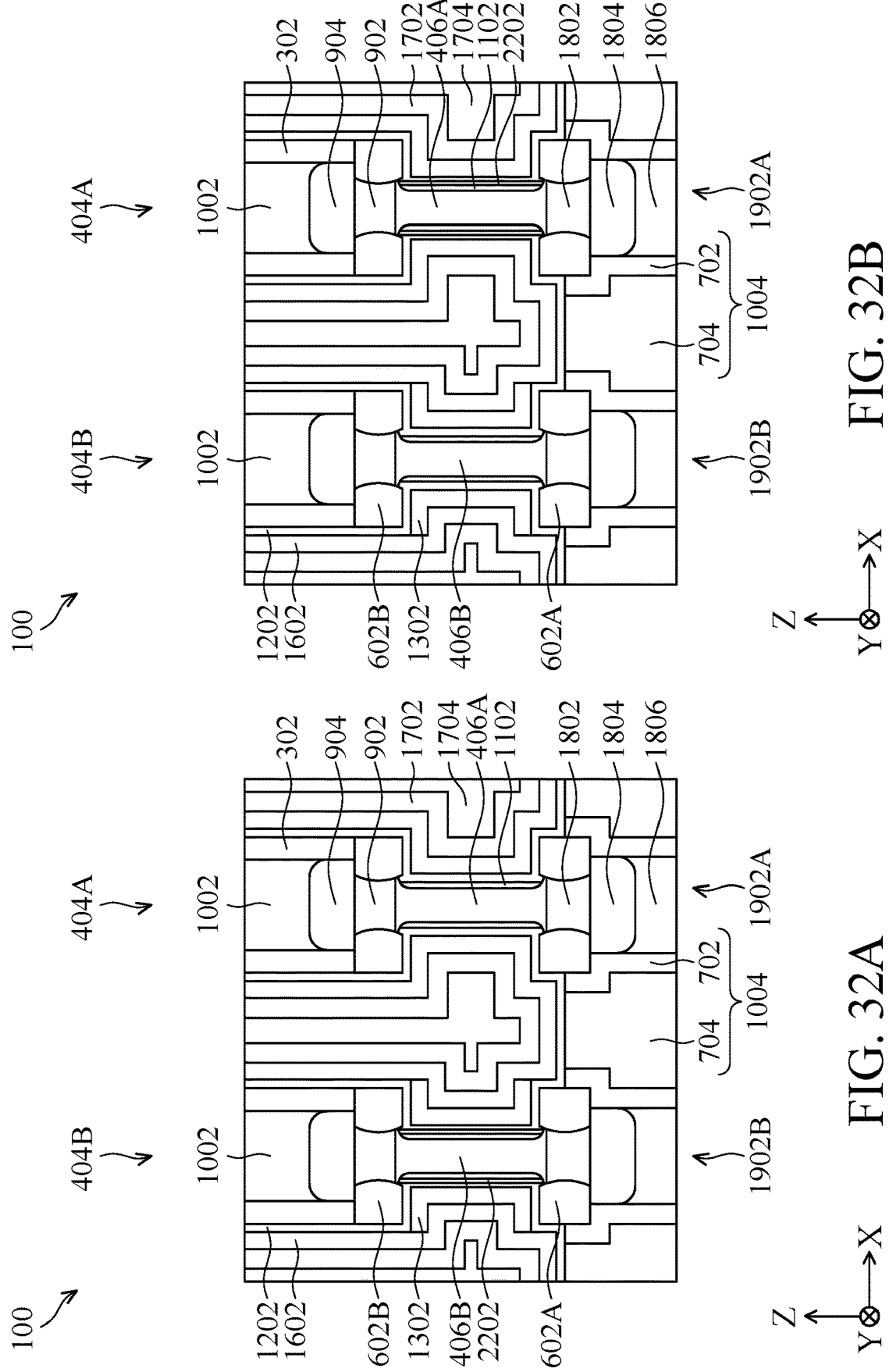
Figure 32C:
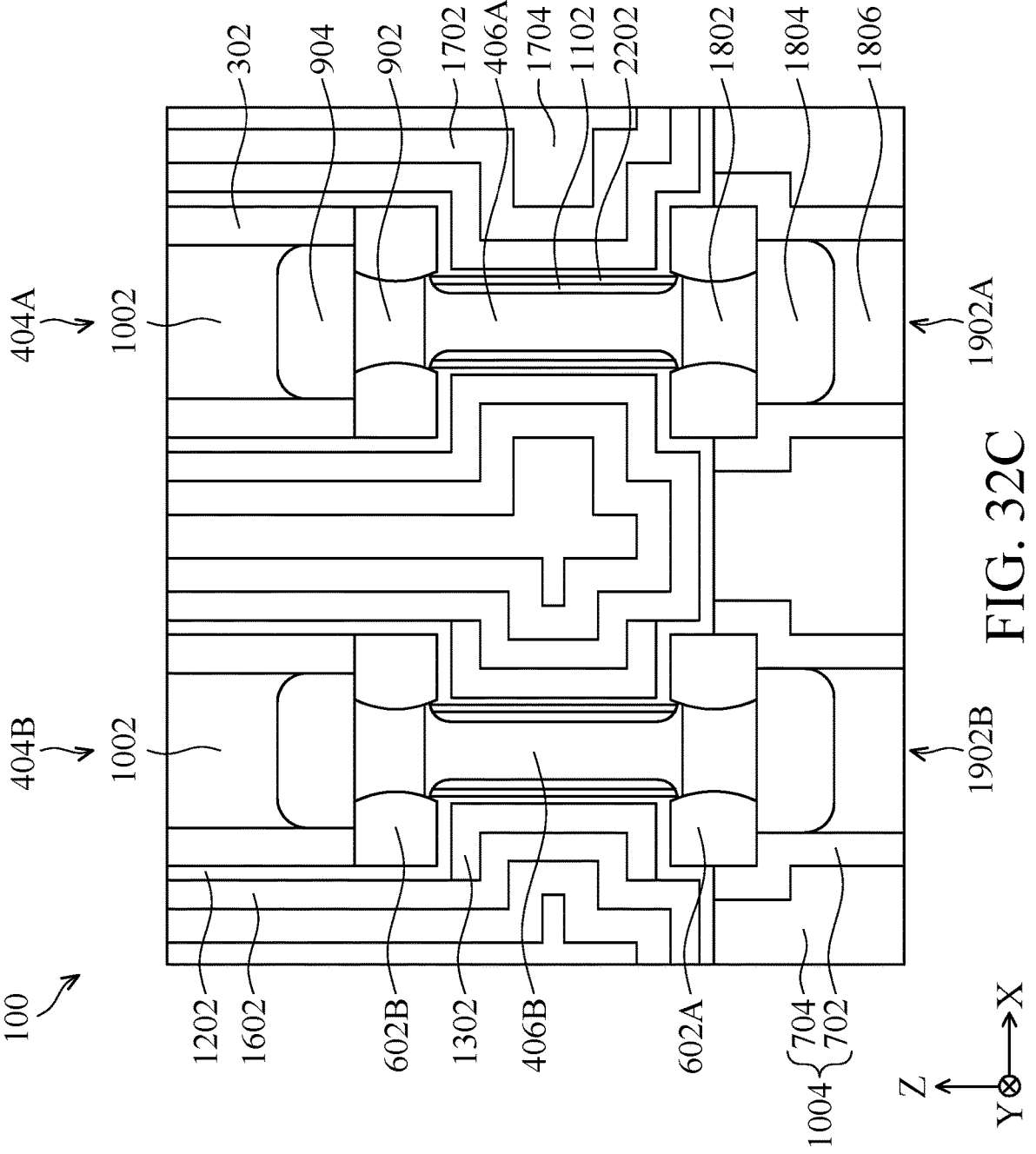

FIGS. 32A, 32B, and 32C are X-Z cross-sectional views of the workpiece 100 at the fabrication stage corresponding to FIG. 27 and along lines A-A' of FIGS. 1, 2, and 28, in accordance with some embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional vertical gate-all-around (VGAA) transistors, in memory (e.g., SRAM) and/or standard logic cells of an integrated circuit (IC) structure. Generally, a VGAA transistor may include a vertically extending sheet (e.g., a nanosheet), wire (e.g., a nanowire), or rod (e.g., a nanorod) in a channel region of the transistor, thereby allowing better gate control, lowered leakage current, and improved scaling capability for various IC applications. While existing technologies for fabricating VGAA transistors have been generally adequate for their intended applications, they have not been entirely satisfactory in all aspects.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including transistors with vertical channel layers wrapped around by different number of work function layers. Further, additional portions of the work function layers on top spacers and inner spacers are removed to increase the process window. The details of the structure and manufacturing methods of the present disclosure are described below in conjunction with the accompanying drawings, which illustrate the process of making VGAA transistors, according to some embodiments.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise excepted.

FIG. 1 is perspective views of a workpiece 100 at various fabrication stages, in accordance with some embodiments of the present disclosure. Referring to FIG. 1, a workpiece 100 is provided. As shown in FIG. 1, the workpiece 100 includes a substrate 102 and a stack 104 over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion. In some embodiments, n-type wells have an n-type dopant concentration of about $5\times10^{16}$ cm$^{-3}$ to about $5\times10^{19}$ cm$^{-3}$, and p-type wells have a p-type dopant concentration of about $5\times10^{16}$ cm$^{-3}$ to about $5\times10^{19}$ cm$^{-3}$. Because the workpiece 100 will be fabricated into a semiconductor structure 100 upon conclusion of the fabrication processes, the workpiece 100 may be referred to as the semiconductor structure 100 as the context requires.

The stack 104 includes semiconductor layers 106A, 106B and 108 alternately stacked over the substrate 102 in the Z-direction. More specifically, the semiconductor layer 106A is formed over the substrate 102, the semiconductor layer 108 is formed over the semiconductor layer 106A, and the semiconductor layer 106B is formed over the semiconductor layer 108. In some aspects, the semiconductor layer 108 is vertically between the semiconductor layers 106A and 106B.

The semiconductor layers 106, 106B and the semiconductor layer 108 may have different semiconductor compositions. In some embodiments, semiconductor layers 106A and 106B are formed of silicon germanium (SiGe) and the semiconductor layer 108 is formed of silicon (Si). In these embodiments, the additional germanium content in the semiconductor layers 106A and 106B allow selective removal or recess of the semiconductor layers 106A and 106B without substantial damages to the semiconductor layer 108, so that the semiconductor layers 106A and 106B are also referred to as sacrificial layers. In some embodiments, the semiconductor layers 106A, 106B and the semiconductor layer 108 are epitaxially grown over (on) the substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), plasma-enhanced CVD (PECVD), a combination thereof, or the like, may also be utilized. The semiconductor layer 106A, the semiconductor layer 108, and the semiconductor layer 106B are deposited alternatingly, one-after-another, to form the stack 104. It should be noted that the semiconductor layer 108 will become vertical channel layers, so that the semiconductor layer 108 may also be referred to as a channel layer.

Figure 3:
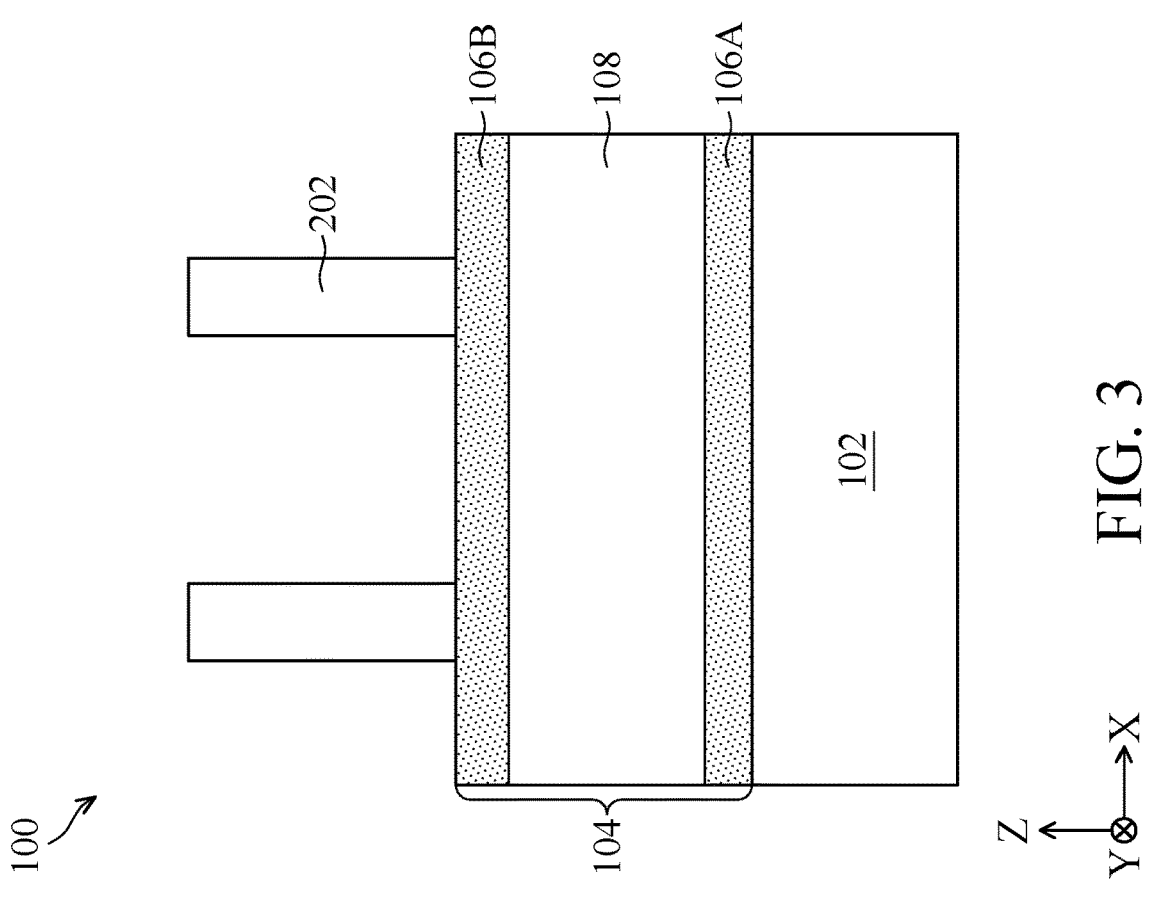
FIG. 3 is an X-Z cross-sectional view of the workpiece at a fabrication stage along lines A-A' of FIGS. 1 and 2, in accordance with some embodiments of the present disclosure.

FIG. 2 is a top view of the workpiece 100 at a fabrication stage of FIG. 1, in accordance with some embodiments of the present disclosure. FIG. 3 is an X-Z cross-sectional view of the workpiece 100 at a fabrication stage along lines A-A' of FIGS. 1 and 2, in accordance with some embodiments of the present disclosure. Referring to FIGS. 2 and 3, hard mask layers 202 are formed over the stack 104 after the formation of the stack 104. Portions of the semiconductor layer 108 directly under the hard mask layers 202 may be formed as channel layers for transistors, as shown in below. It should be noted that four hard mask layers 202 are formed over the stack 104 as shown in FIG. 2, which are for illustrative purposes only and not intended to be limiting beyond what is specifically recited in the claims. The number of hard mask layers depends on the desired number of transistors. The hard mask layers 202 each may be a single layer or a multi-layer. In some embodiments, each of the hard mask layers 202 is a single layer and includes a nitride layer, such as silicon nitride. In some embodiments, each of the hard mask layers 202 is a multi-layer and includes a silicon nitride layer and a silicon oxide layer over the silicon nitride layer. In some embodiments, the hard mask layers 202 are formed by a deposition process, such as CVD, LPCVD, plasma-enhanced CVD (PECVD), atomic layer deposition (ALD), a combination thereof, or the like, may also be utilized.

Figures 4, 5:
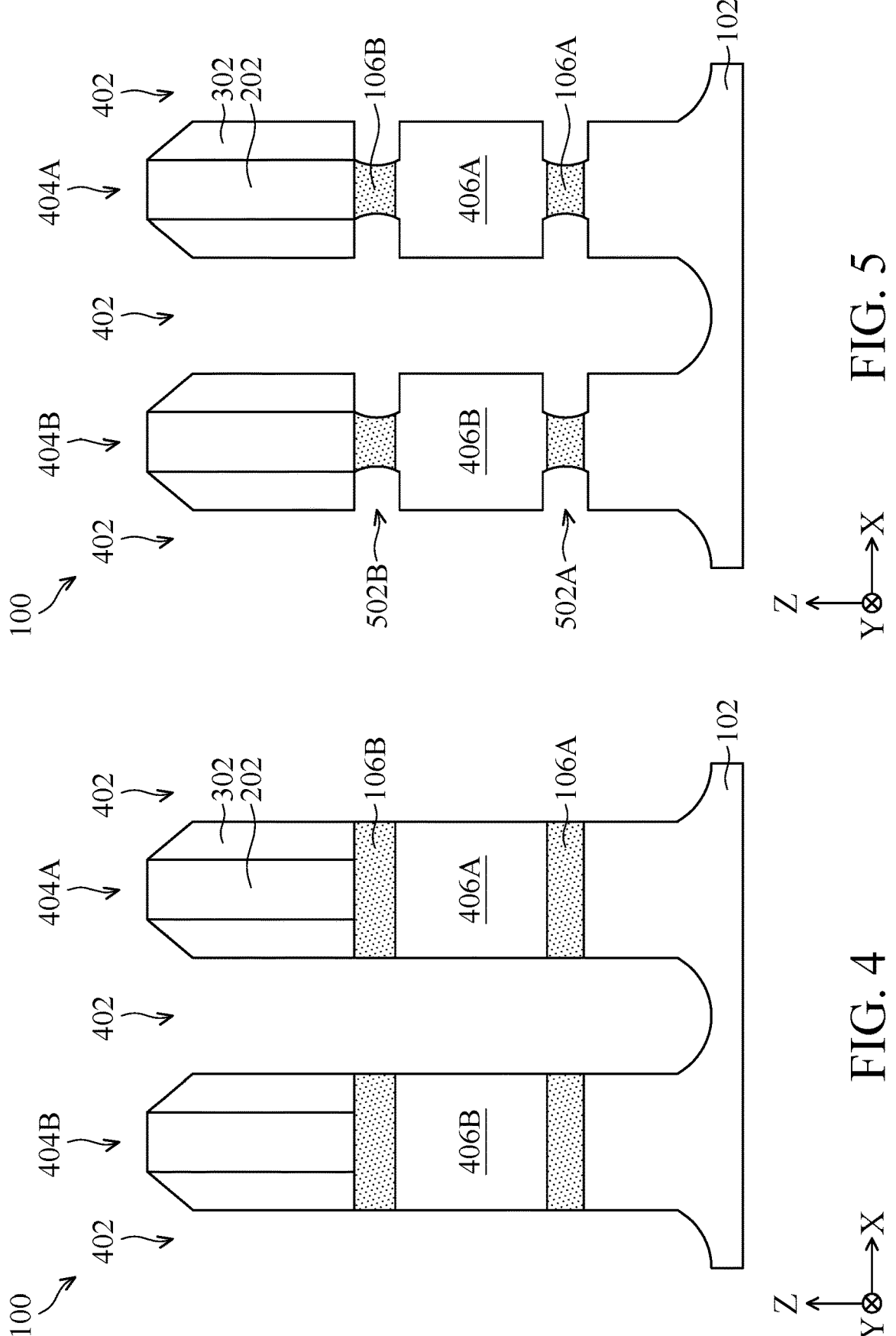
FIGS. 4, 5, 6, 7, 8, 9, 10, 11, 12, 13, 14, 15, 16, 17, 18, 19, 20, 21, 22, 23, 24, 25, 26, and 27 are X-Z cross-sectional views of the workpiece at various fabrication stages along lines A-A' of FIGS. 1 and 2, in accordance with some embodiments of the present disclosure.

FIGS. 4 to 27 are X-Z cross-sectional views of the workpiece 100 at various fabrication stages along lines A-A' of FIGS. 1 and 2, in accordance with some embodiments of the present disclosure. Referring to FIG. 4, top spacers 302 are formed on sidewalls of the hard mask layers 202 and over a top surface of the stack 104. More specifically, the top spacers 302 are formed on opposite sidewalls of the hard mask layers 202, as shown in FIG. 4. In some aspects, the top spacers 302 are formed around the hard mask layers 202. The top spacers 302 may include silicon nitride (Si$_3$N$_4$), silicon oxide (SiO$_2$), silicon carbide (SiC), silicon oxycarbide (SiOC), silicon oxynitride (SiON), silicon carbon nitride (SiCN), silicon oxycarbon nitride (SiOCN), carbon doped oxide, nitrogen doped oxide, porous oxide, or combinations thereof. In some embodiments, the top spacers 302 may be formed by conformally depositing a spacer layer (containing the dielectric material) over the stack 104 and the hard mask layers 202, followed by an anisotropic etching process to remove top portions of the spacer layer from the top surfaces of the stack 104 and the hard mask layers 202. After the etching process, portions of the spacer layer on sidewall surfaces of the hard mask layers 202 substantially remain and become the top spacers 302. In some embodiments, the anisotropic etching process is a dry (e.g., plasma) etching process. Additionally or alternatively, the formation of the top spacers 302 may also involve chemical oxidation, thermal oxidation, ALD, CVD, and/or other suitable methods.

Still referring to FIG. 4, the stack 104 is recessed and patterned to form trenches 402 in the stack 104 (or passing through the semiconductor layers 106B, 108, and 106A). Specifically, the trenches 402 may be formed by performing one or more etching processes to remove portions of the semiconductor layer 106B, the semiconductor layer 108, the semiconductor layer 106A, and the substrate 102 that do not vertically overlap or be covered by the hard mask layers 202 and the top spacers 302 around (or on sidewalls of) the hard mask layers 202. In some embodiments, a single etchant may be used to remove the semiconductor layer 106B, the semiconductor layer 108, the semiconductor layer 106A, and the substrate 102, whereas in other embodiments, multiple etchants may be used to perform the etching process. The semiconductor layer 108 is patterned to form channel layers vertically overlap or be covered by the hard mask layers 202 and the top spacers 302. As shown in FIG. 4, in some embodiments, the semiconductor layer 108 is patterned to form a channel layer 406A in region 404A and a channel layer 406B in region 404B. The channel layer 406A and 406B may be collectively referred to as channel layers 406. Furthermore, sidewalls of the channel layers 406 and the semiconductor layer 106A, 106B that vertically overlap or be covered by the hard mask layers 202 and the top spacers 302 are exposed in the trenches 402, as shown in FIG. 4. The trenches 402 may be connected together in other region and collectively referred to as a single trench. In some embodiments, although not shown in FIG. 4, top portions of the hard mask layers 202 and the top spacers 302 around the hard mask layers 202 are removed, such that heights of the hard mask layers 202 and the top spacers 302 are reduced.

Referring to FIG. 5, side portions of the semiconductor layers 106A and 106B are removed via a selective etching process. Specifically, the selective etching process is performed that selectively etches the side portions of the semiconductor layers 106A and 106B below the top spacers 302 through the trenches 402, with minimal (or no) etching of the channel layers 406, such that gaps 502A are formed between the channel layers 406 and the substrate 102 and gaps 502B are formed between the top spacers 302 and the channel layers 406, and are formed below the top spacers 302. The selective etching process is a dry etching process, a wet etching process, other suitable etching process, or combinations thereof. The etching process is configured to laterally etch (e.g., along the X-direction) the semiconductor layers 106A and 106B below the top spacers 302. In some embodiments, portions of the channel layers 406 and the substrate 102 are removed during the selective etching process, such that sidewalls of the channel layers 406 and the substrate 102 are exposed in the gaps 502A and 502B. As such, a thickness of the channel layers 406 directly under the top spacers 302 is less than a thickness of the channel layers 406 directly under the hard mask layers 202, as shown in FIG. 4. In some aspects, sidewalls of top ends and bottom ends of the channel layers 406 are exposed in the gaps 502A and 502B. In some embodiments, the remaining semiconductor layers 106A and 106B have concave sidewalls.

Figures 6, 7:
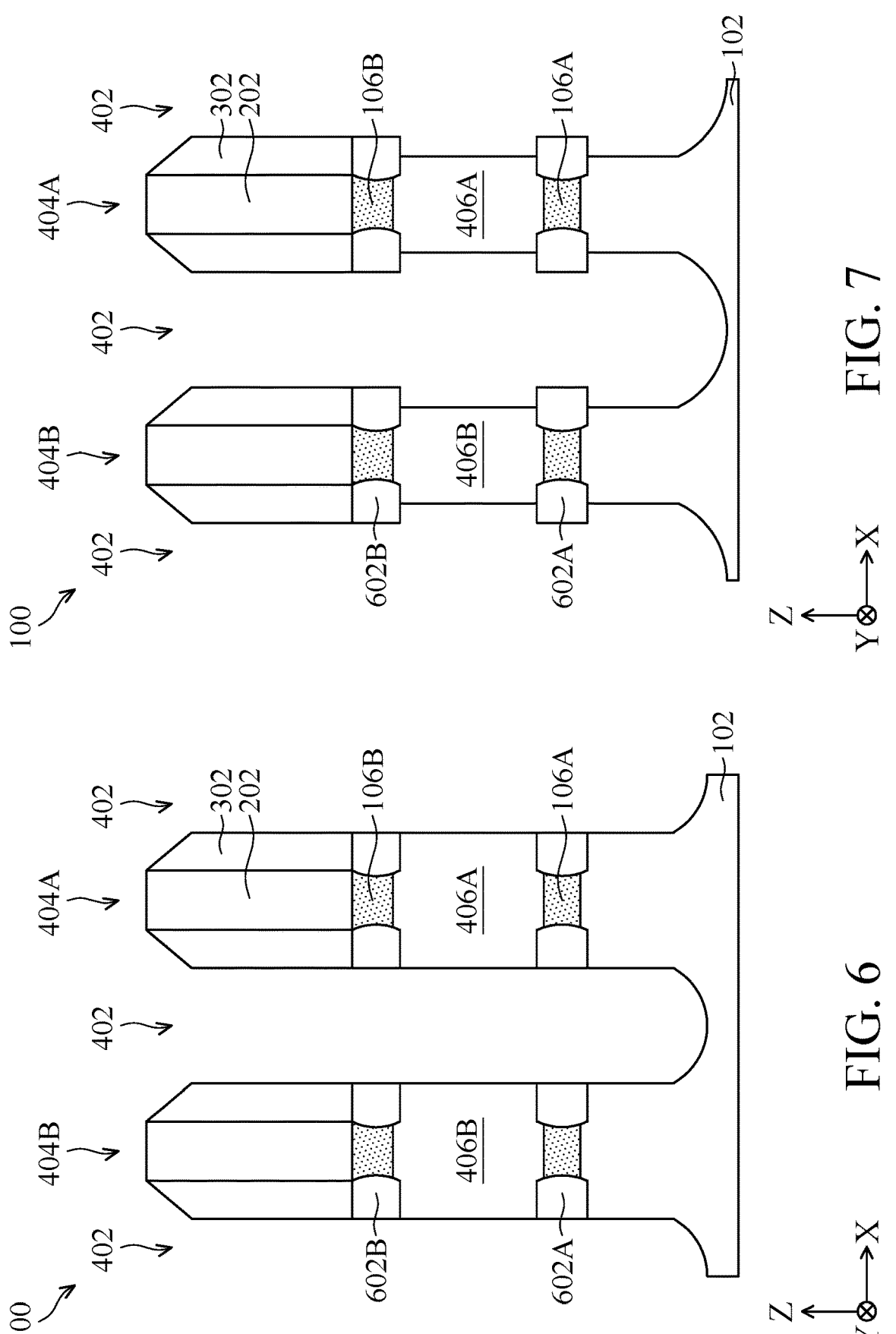

Referring to FIG. 6, lower inner spacers 602A are formed to fill the gaps 502A and the upper inner spacers 602B are formed to fill the gaps 502B (may be referred to as inner spacers 602A and 602B or be collectively referred to as inner spacers 602). In some embodiments, sidewalls of the inner spacers 602 are aligned to the sidewalls of the top spacers 302 and the channel layers 406, as shown in FIG. 6. The lower inner spacers 602A are formed under the channel layers 406 and the upper inner spacers 602B are formed over the channel layers 406. More specifically, the lower inner spacers 602A are formed between the channel layers 406 and the substrate 102 and upper inner spacers 602B are formed between the top spacers 302 and the channel layers 406. The inner spacers 602 have convex sidewalls due to the concave sidewalls of the semiconductor layers 106A and 106B discussed above. In some embodiments, the upper inner spacers 602B are formed around the top ends of the channel layers 406 and the lower inner spacers 602A are formed around the bottom ends of the channel layers 406, as shown in FIG. 6. Further, a thickness of the upper inner spacers 602B in the Z-direction is greater than a thickness of the semiconductor layer 106B in the Z-direction; and a thickness of the lower inner spacers 602A in the Z-direction is greater than a thickness of the semiconductor layer 106A in the Z-direction.

In order to form the inner spacers 602, a deposition process forms a spacer layer into the trenches 402 and the gaps 502A and 502B, such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the trenches 402. The deposition process is configured to ensure that the spacer layer fills the gaps 502A between the channel layers 406 and the substrate 102 and the gaps 502B between the top spacers 302 and the channel layers 406. An etching process is then performed that selectively etches the spacer layer to form inner spacers 602 with minimal (to no) etching of the semiconductor layer 108, the substrate 102, the hard mask layers 202, and the top spacers 302. The spacer layer (and thus inner spacers 602) includes a material that is different than a material of the semiconductor layers 108 and a material of the top spacers 302 to achieve desired etching selectivity during the etching process. In some embodiments, the inner spacers 602 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacers 602 include a low-k dielectric material, such as those described herein.

Referring to FIG. 7, after the formation of the inner spacers 602, an etching process is performed to remove portions of the channel layers 406 and the substrate 102. The etching process may be an isotropic etching process, such as a wet etching process. After the etching process, the sidewalls of the channel layers 406 and the substrate 102 are not aligned with the sidewalls of the top spacers 302 and the inner spacers 602. More specifically, the sidewalls of the channel layers 406 are directly below the top spacers 302 and the upper inner spacers 602B, and the sidewalls of the substrate 102 are directly below the top spacers 302 and the inner spacers 602, as shown in FIG. 7. Further, (portions of) bottom surfaces of the upper inner spacers 602B and (portions of) bottom surfaces and top surfaces of the lower inner spacers 602A are exposed in the trenches 402.

Figures 8, 9:
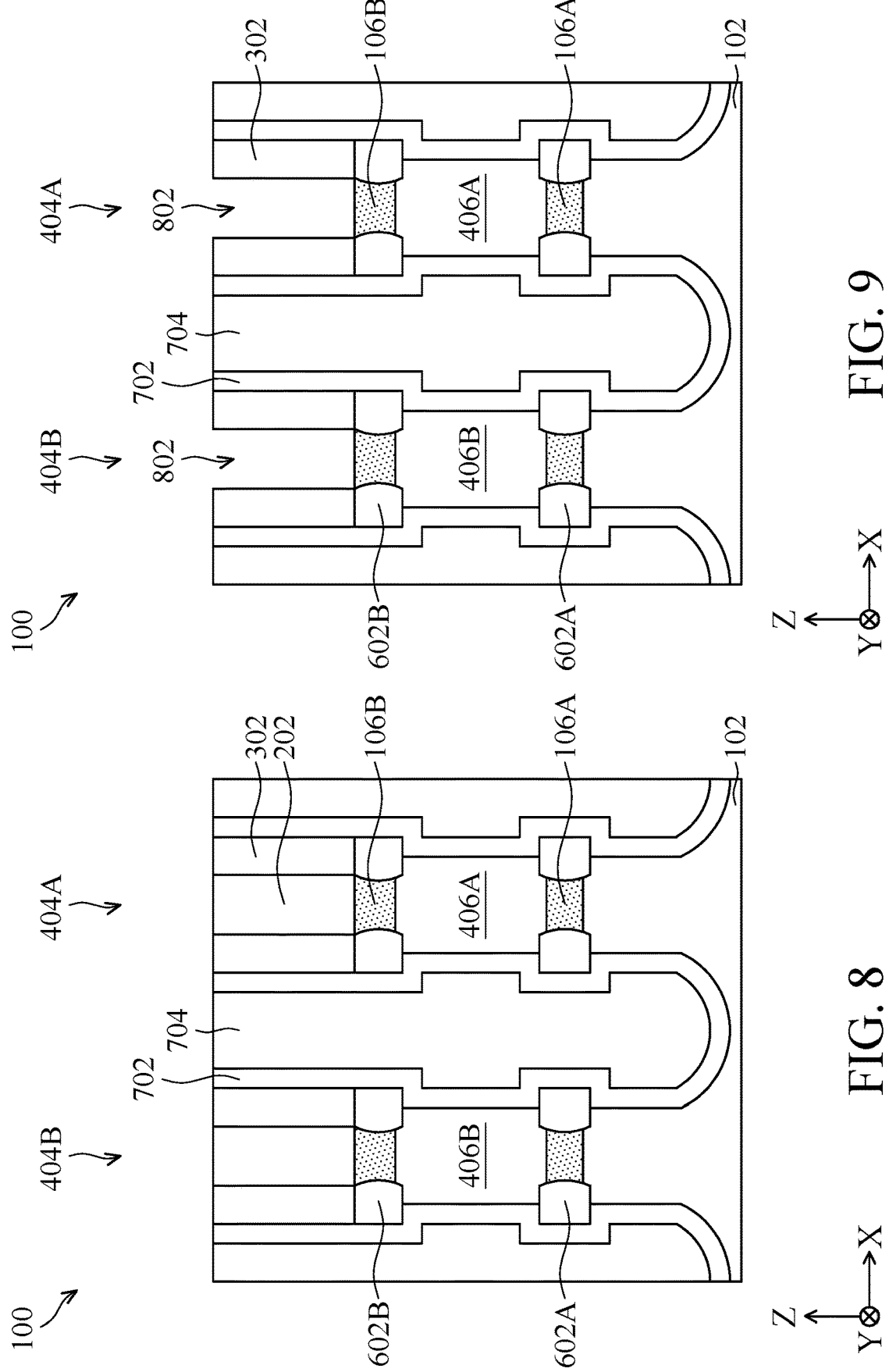

Referring to FIG. 8, a liner layer 702 is conformally formed on the hard mask layer 202, the top spacers 302, the upper inner spacers 602B and the lower inner spacers 602A, the channel layers 406, and the substrate 102, and then an isolation material 704 is formed on (or between) the liner layer 702, in some embodiments. More specifically, the liner layer 702 is conformally formed over the hard mask layer 202, the top spacers 302, and the substrate 102, and on the sidewalls of the top spacers 302, the upper inner spacers 602B, the channel layers 406, the lower inner spacers 602A, and the substrate 102. Further, the liner layer 702 is also conformally formed on the portions of the bottom surfaces of the upper inner spacers 602B and on the portions of the bottom surfaces and the top surfaces of the lower inner spacers 602A.

Next, the isolation material 704 is formed over the liner layer 702 to fill the space between the liner layer 702, such that the isolation material 704 is formed inside the liner layer 122. After the formation of the liner layer 702 and the isolation material 704, a planarization process (e.g., a chemical mechanical polishing (CMP) process) is performed until top surfaces of the hard mask layer 202 and the top spacers 302 are exposed. In some embodiments, top portions of the hard mask layers 202 and the top spacers 302 around the hard mask layers 202 are removed, such that heights of the hard mask layers 202 and the top spacers 302 are reduced during the planarization process, as shown in FIG. 8.

In some embodiments, the liner layer 702 is made of silicon nitride. The liner layer 702 is formed by a CVD, a PVD, an ALD, and/or other suitable process. In some embodiments, the isolation material 704 may be a dielectric material including silicon oxide, silicon nitride, silicon oxynitride, fluorine-doped silicate glass (FSG), a low-k dielectric, combinations thereof, and/or other suitable materials. In various embodiments, the dielectric material may be deposited by a CVD, a subatmospheric CVD (SACVD), a flowable CVD (FCVD), an ALD, spin-on coating, and/or other suitable process.

Referring to FIG. 9, the hard mask layers 202 are removed by performing an etching process to form openings 802. The etching process is a selective etching process that selectively etches the hard mask layers 202, with minimal (or no) etching of the top spacers 302, the liner layer, and the isolation material 704, such that the openings 802 are formed. The selective etching process is a dry etching process, a wet etching process, other suitable etching process, or combinations thereof. In some embodiments, top surfaces of the semiconductor layer 106B and the sidewalls of the top spacers 302 are exposed in the openings 802, as shown in FIG. 9. At this stage, a width of the openings 802 in the X-direction and a width of topmost surfaces of the semiconductor layer 106B in the X-direction are substantially the same.

Figures 10, 11:
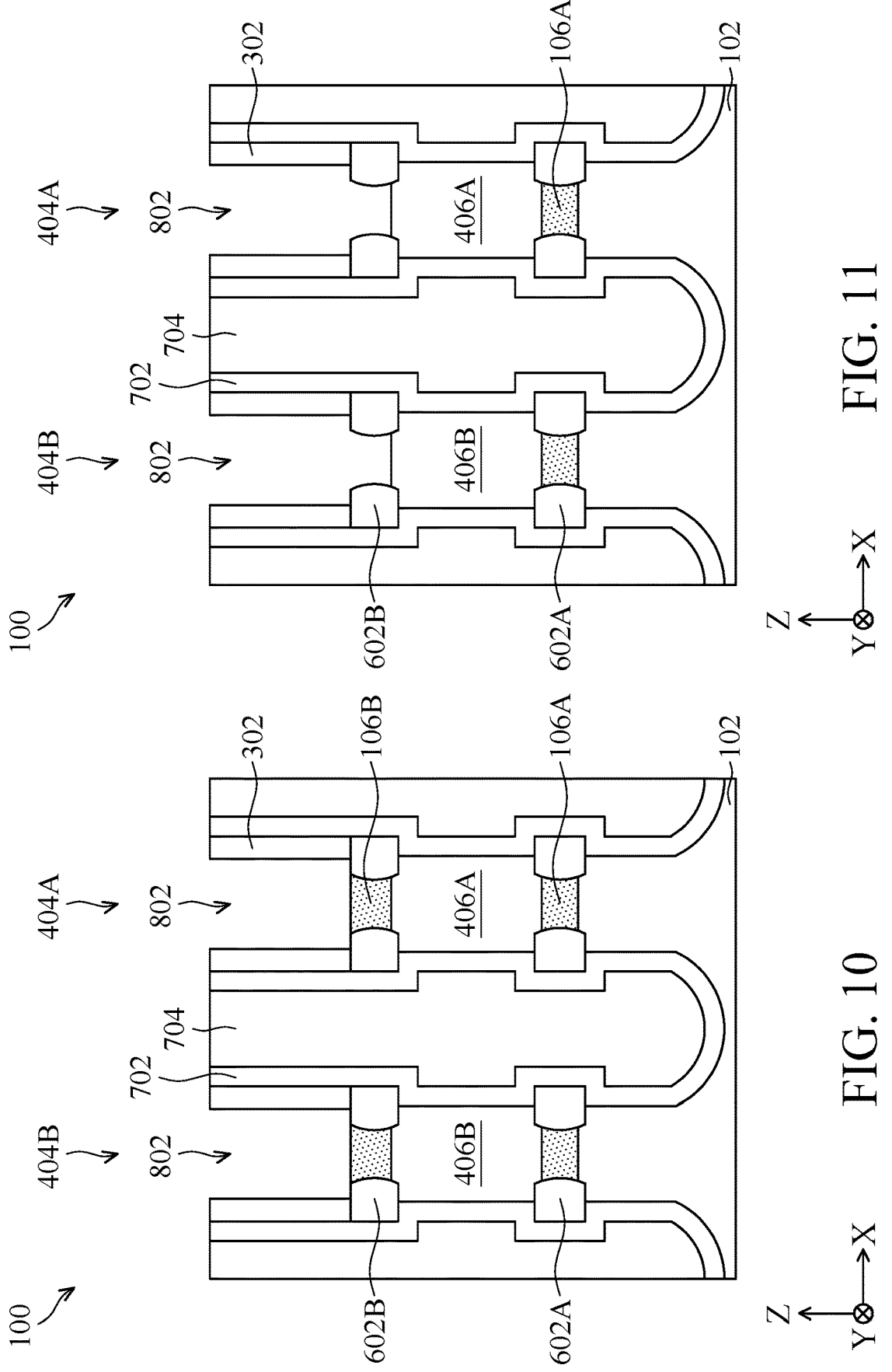

Referring to FIG. 10, portions of the top spacers 302 exposed in the openings 802 are trimmed. In some embodiments, one or more etching processes (such as a wet etching or plasma etching) are performed to laterally etch the top spacers 302 along the X-direction. The etching processes may also reduce a width (in the X-direction) of the top spacers 302. Further, in some embodiments, the etching processes are configured to selectively etch the top spacers 302 with minimal (to no) etching of other features, such as the semiconductor layer 106B and the upper inner spacers 602B. As shown in FIG. 10, after the trimming of the top spacers 302, portions of top surfaces of the upper inner spacers 602B are exposed in the openings 802.

Referring to FIG. 11, the semiconductor layer 106B is removed by performing an etching process. The etching process is a selective etching process that selectively etches the semiconductor layer 106B, with minimal (or no) etching of the top spacers 302, the upper inner spacers 602B, and the channel layers 406, such that top surfaces of the channel layers 406 and the (convex) sidewalls of the upper inner spacers 602B are exposed in the openings 802.

Figures 12, 13:
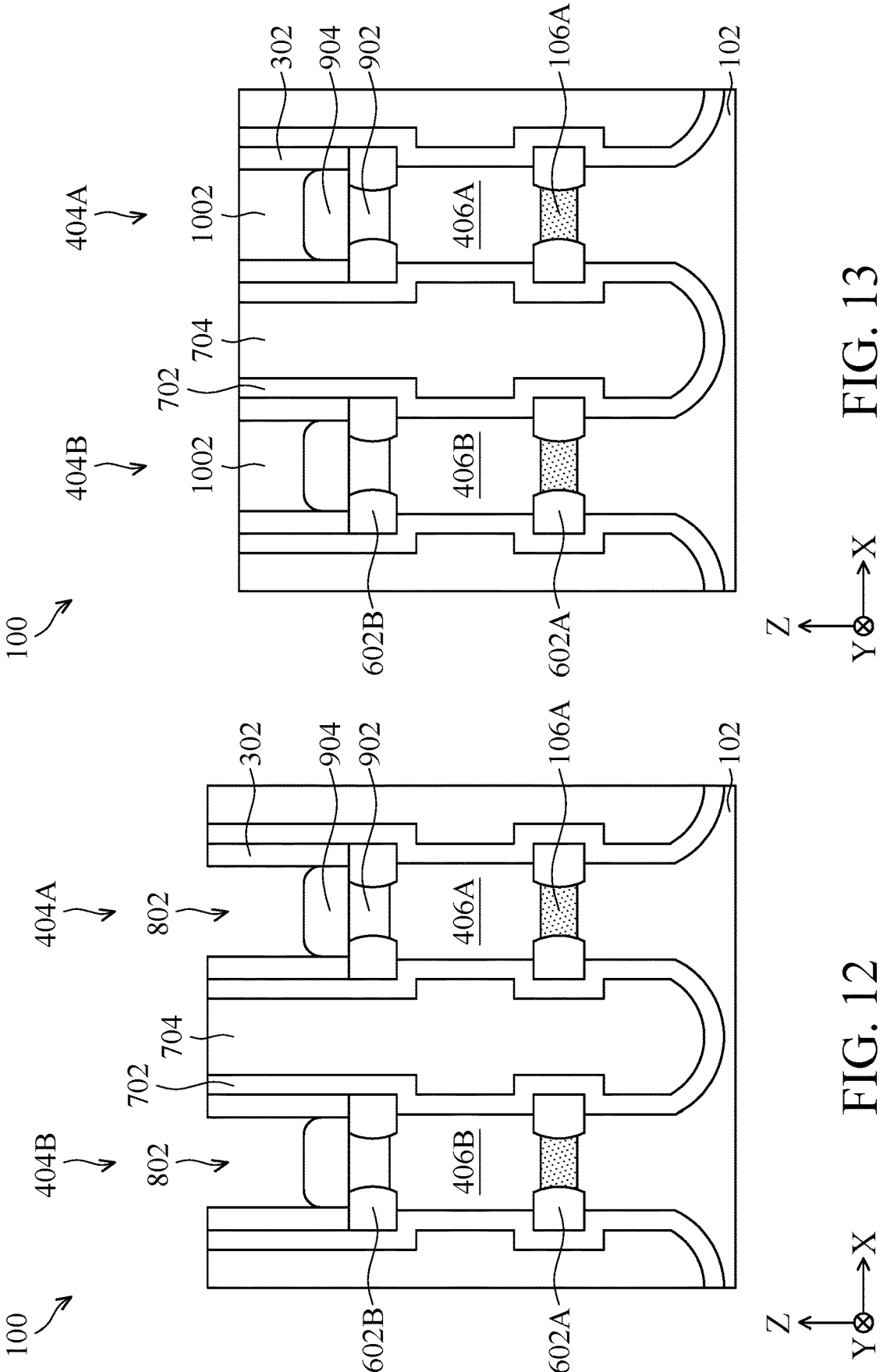

Referring to FIG. 12, lightly doped drain (LDD) features 902 are formed in the openings 802, and source/drain features 904 are formed over the LDD features 902. The LDD features 902 have concave sidewalls due to the convex sidewalls of the upper inner spacers 602B. In some embodiments, the LDD features 902 are formed between and in contact with the upper inner spacers 602B. In some aspects, the upper inner spacers 602B are around the LDD features 902. As shown in FIG. 12, top surfaces of the LDD features 902 are substantially level with the top surfaces of the upper inner spacers 602B. In some embodiments, the top surfaces of LDD features 902 are lower than the top surfaces of the upper inner spacers 602B. In some embodiments, the LDD features 902 are formed over and electrically connected to the channel layers 406. As shown in FIG. 12, bottom surfaces of the LDD features 902 are in contact with the top ends of the channel layers 406. Therefore, the LDD features 902 may also be referred to as top LDD features. In some embodiments, the bottom surfaces of the LDD features 902 are higher than the bottom surfaces of the upper inner spacers 602B.

The source/drain features 904 have convex top surfaces, as shown in FIG. 12. In some embodiments, the source/drain features 904 are formed between and in contact with the top spacers 302. In some aspects, the top spacers 302 are around the source/drain features 904. As shown in FIG. 12, bottommost surfaces of the source/drain features 904 are substantially level with the top surfaces of the upper inner spacers 602B. In some embodiments, the bottommost surfaces of the source/drain features 904 are lower than the top surfaces of the upper inner spacers 602B. In some embodiments, the source/drain features 904 are formed over and electrically connected to the channel layers 406 and the LDD features 902. As shown in FIG. 12, bottom surfaces of the source/drain features 904 are in contact with the top surfaces of the LDD features 902 and the upper inner spacers 602B. Therefore, the source/drain features 904 may also be referred to as top source/drain features.

One or more epitaxy processes may be employed to grow the LDD features 902 and the source/drain features 904. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The LDD features 902 and the source/drain features 904 may include any suitable semiconductor materials.

For example, the LDD features 902 and the source/drain features 904 for n-type VGAA transistors may include epitaxially-grown material selected from a group consisting of SiP, SiC, SiPC, SiAs, Si, or a combination thereof. In some embodiments, the epitaxially-grown material of the LDD features 902 and the source/drain features 904 may be doped with n-type dopants (such as phosphorus, arsenic, other n-type dopant, or combinations thereof). In some embodiments, the LDD features 902 and the source/drain features 904 for n-type VGAA transistors may be respectively referred to as n-type LDD features and n-type source/drain features.

In another example, the LDD features 902 and the source/drain features 904 for p-type VGAA transistors may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the LDD features 902 and the source/drain features 904 may be doped with p-type dopants (such as boron, indium, other p-type dopant, or combinations thereof). In some embodiments, the LDD features 902 and the source/drain features 904 for p-type VGAA transistors may be respectively referred to as p-type LDD features and p-type source/drain features.

The source/drain features 904 may also be referred to as source/drain, or source/drain regions. In some embodiments, the source/drain features 904 may refer to a source or a drain, individually or collectively dependent upon the context. The LDD features 902 and the source/drain features 904 may be doped in-situ or ex-situ. One or more annealing processes may be performed to activate the dopants in the LDD features 902 and the source/drain features 904. The annealing processes may include rapid thermal annealing (RTA) and/or laser annealing processes.

Referring to FIG. 13, hard mask layers 1002 are formed over the source/drain features 904. In order to form the hard mask layers 1002, a deposition process forms a dielectric material into the openings 802 and over the top spacers 302, the liner layer 702, the isolation material 704, and the source/drain features 904. A planarization process (e.g., a chemical mechanical polishing (CMP) process) is then performed on the dielectric material until the top surfaces of the top spacers 302, the liner layer 702, and the isolation material 704 are exposed, thereby the remaining dielectric material in the openings 802 are formed into the hard mask layers 1002. In some embodiments, top portions of the top spacers 302, the liner layer 702, and the isolation material 704 are removed, such that heights of the top spacers 302, the liner layer 702, and the isolation material 704 are reduced during the planarization process, as shown in FIG. 13. The hard mask layers 1002 have concave bottom surfaces due to the convex top surfaces of the source/drain features 904. In some embodiments, the hard mask layers 1002 are formed between and in contact with the top spacers 302. In some aspects, the top spacers 302 are around the hard mask layers 100. The hard mask layers 1002 each may be a single layer or a multi-layer. In some embodiments, each of the hard mask layers 1002 is a single layer and includes a nitride layer, such as silicon nitride. In some embodiments, each of the hard mask layers 1002 is a multi-layer and includes a silicon nitride layer and a silicon oxide layer over the silicon nitride layer. In some embodiments, the deposition process for forming the dielectric material of the hard mask layers 1002 includes CVD, LPCVD, plasma-enhanced CVD (PECVD), a combination thereof, or the like, may also be utilized.

Figures 14, 15:
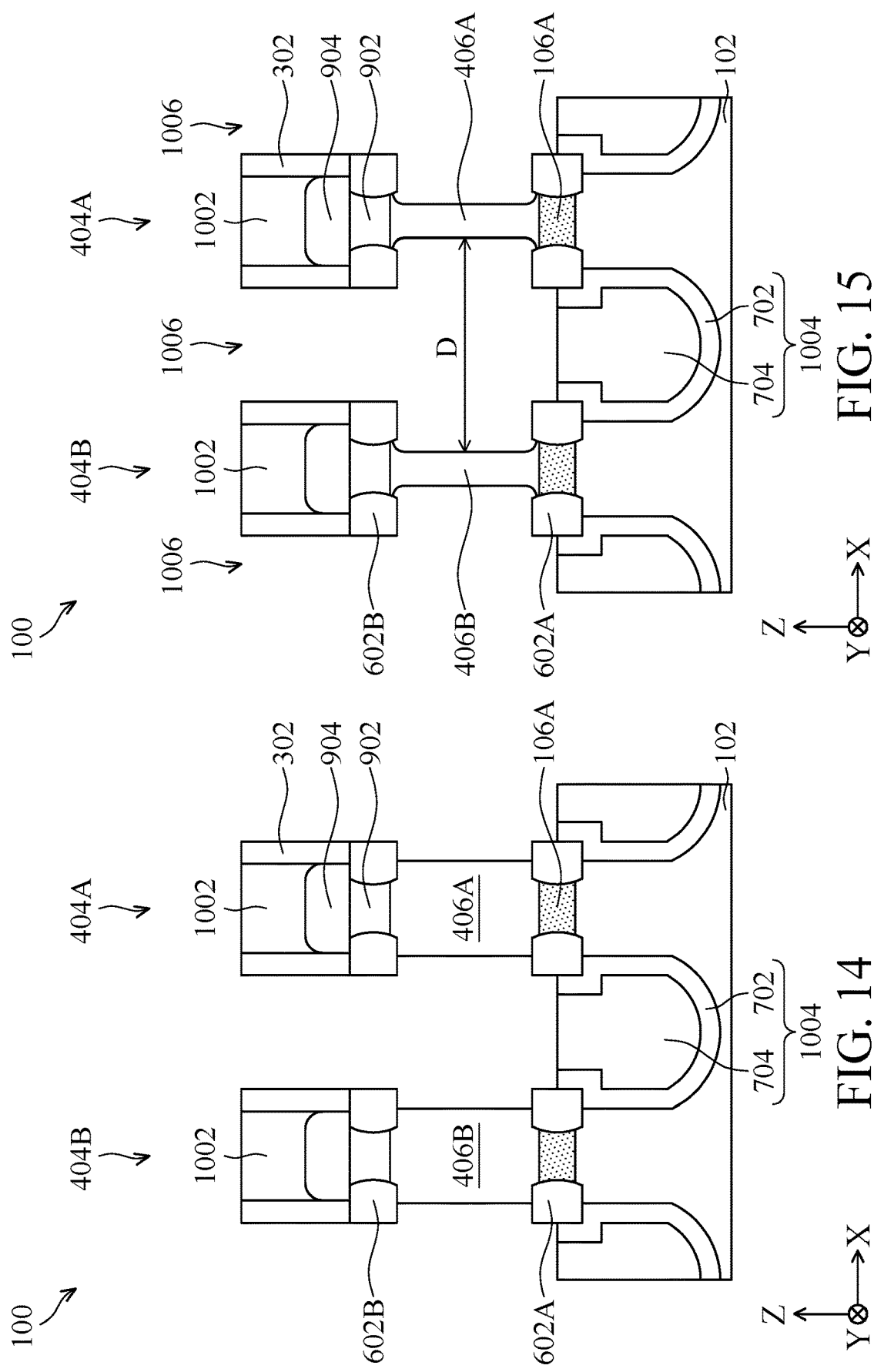

Referring to FIG. 14, the liner layer 702 and the isolation material 704 are recessed to form isolation structure 1004. More specifically, an etching process is performed to remove portions of the liner layer 702 and the isolation material 704 to form trenches 1006, and remaining portions of the liner layer 702 and the isolation material 704 are formed into isolation structure 1004. The etching process may be an isotropic etching process, such as a wet etching process. In some embodiments, the etching process is a selective etching process that selectively etches the liner layer 702 and the isolation material 704, with minimal (or no) etching of the hard mask layers 1002, the top spacers 302, the upper inner spacers 602B, the channel layers 406, and the lower inner spacers 602A. The trenches 402 may be connected together in other region and collectively referred to as a single trench.

After the recessing of the liner layer 702 and the isolation material 704, the sidewalls of the top spacers 302, the upper inner spacers 602B, the channel layers 406, and the lower inner spacers 602A are exposed in the trenches 1006. It is noted that top portions of the sidewalls of the lower inner spacers 602A are exposed. The bottom portions of the sidewalls of the lower inner spacers 602A are covered by the isolation structure 1004 (more specifically, the liner layer 702). As shown in FIG. 14, the isolation structure 1004 is between the lower inner spacers 602A. Further, top surfaces of the isolation structure 1004 are lower than the top surfaces of the lower inner spacers 602A and bottom surfaces of the channel layers 406. In some embodiments, the top surfaces of the isolation structure 1004 are higher than top surfaces of the substrate 102.

Referring to FIG. 15, portions of the channel layers 406 exposed in the trenches 1006 are trimmed. More specifically, the channel layers 406 are trimmed to remove the portions of the channel layers 406 vertically between the upper inner spacers 602B and the lower inner spacers 602A, as shown in FIG. 15. In some embodiments, one or more etching processes (such as a wet etching or plasma etching) are performed to laterally etch the channel layers 406 along the X-direction. The etching processes may also reduce a width (in the X-direction) of the channel layers 406. Further, in some embodiments, the etching processes are configured to selectively etch the channel layers 406 with minimal (to no) etching of other features, such as top spacers 302, the upper inner spacers 602B, the lower inner spacers 602A, and the isolation structure 1004 (the liner layer 702 and the isolation material 704).

As shown in FIG. 15, after the trimming of the channel layers 406, each of the channel layers 406 have an I-shaped structure in the X-Z cross-sectional view. More specifically, widths of the top ends and the bottom ends of the channel layers 406 in the X-direction are greater than a width of middle portions of the channel layers 406 in the X-direction. In some aspects, the channel layers 406 have concave sidewalls. In other embodiments, the channel layers 406 have a pillar structure with vertical sidewalls. As shown in FIG. 15, the channel layers 406 are perpendicular to the isolation structure 1004 and the substrate 102. Further, the channel layers 406 extend in the Z-direction perpendicular to the X-direction and the Y-direction (or in a normal line of an X-Y plane). As such, the resultant transistors with the channel layers 406 are formed into VGAA transistors.

As discussed above, the upper inner spacers 602B are formed in contact with and around the top ends of the channel layers 406, and the lower inner spacers 602A are formed in contact with and around the bottom ends of the channel layers 406. In some embodiments, the top surfaces of the channel layers 406 are higher than bottom surfaces of the upper inner spacers 602B. In other words, the bottom surfaces of the upper inner spacers 602B are lower than the top surfaces of the channel layers 406. The bottom surfaces of the channel layers 406 are lower than the top surfaces of the lower inner spacers 602A. In other words, the top surfaces of the inner spacers 602A are higher than bottom surfaces of the channel layers 406. Further, as shown in FIG. 15, a distance D between the channel layer 406A in the region 404A and the channel layer 406B in the region 404B in the X-direction is in a range from about 20 nm to about 60 nm.

Figures 16, 17:
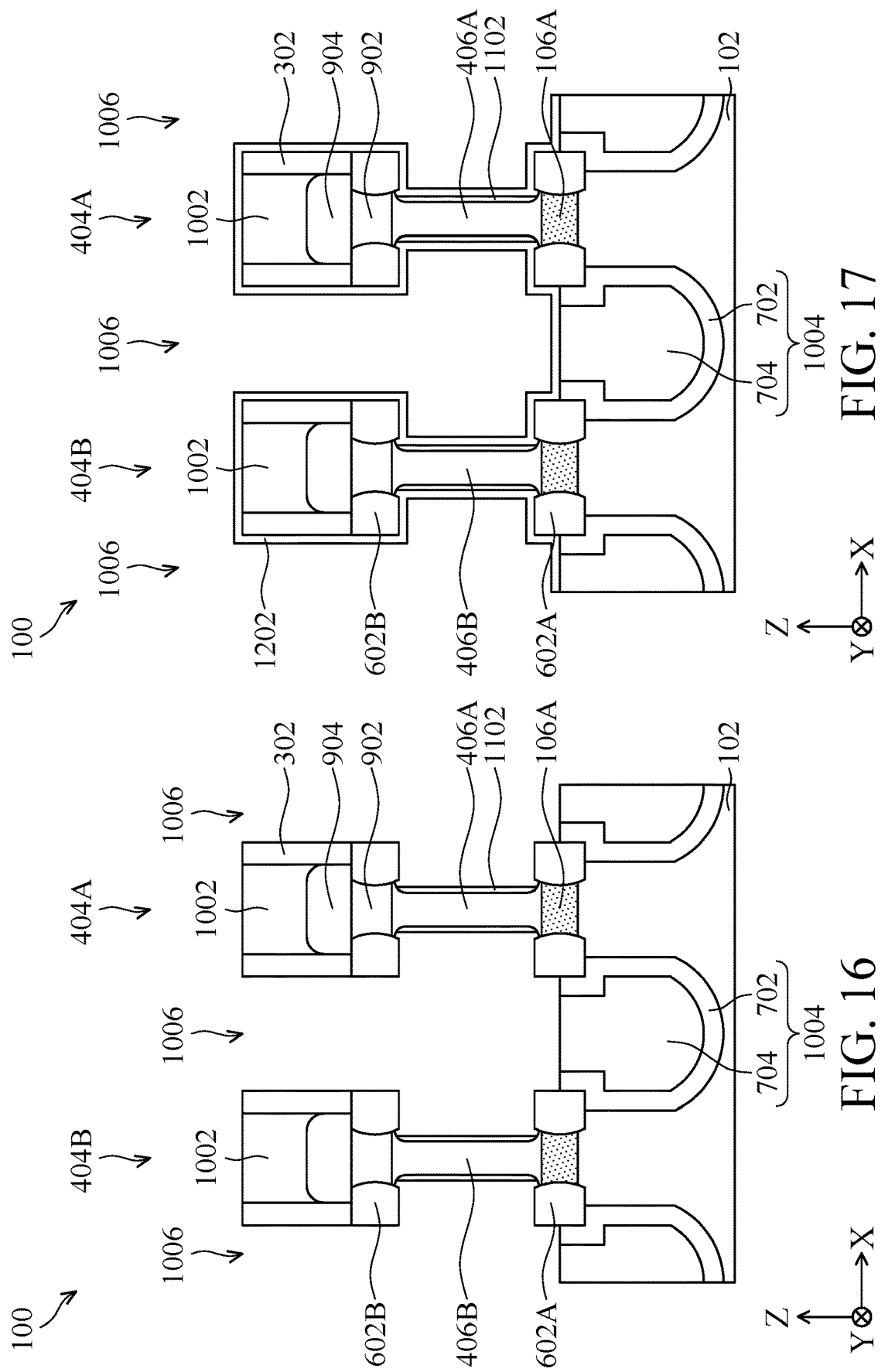

Referring to FIG. 16, interfacial layers 1102 are formed to wrap around the channel layers 406 in the regions 404A and 404B. More specifically, the interfacial layers 1102 are formed on the sidewalls of the channel layers 406A and 406B exposed in the trenches 1006. In some embodiments, a thickness of the interfacial layers 1102 in the X-direction is in a range from about 0.5 nm to about 1.5 nm. In some embodiments, the interfacial layer 1404 may include a dielectric material such as silicon oxide (SiO$_2$), HfSiO, or silicon oxynitride (SiON). The interfacial layer may be formed by chemical oxidation, thermal oxidation, ALD, CVD, and/or other suitable method.

Referring to FIG. 17, a gate dielectric layer 1202 is formed in the regions 404A and 404B to wrap around the channel layers 406. More specifically, the gate dielectric layer 1202 is conformally formed over the hard mask layers 1002, the top spacers 302, the isolation structure 1004, on the sidewalls of the top spacers, the upper inner spacers 602B, the lower inner spacers 602A, and the interfacial layers 1102. In some aspects, the gate dielectric layer 1202 includes extending portions covering the sidewalls of the upper inner spacers 602B, the lower inner spacers 602A, and the top spacers 302. Further, the gate dielectric layer 1202 is also formed on the bottom surfaces of the upper inner spacers 602B and the top surfaces of the lower inner spacers 602A. As such, the gate dielectric layer 1202 wraps around the interfacial layers 1102 and the channel layers 406, as shown in FIG. 17. More specifically, the interfacial layers 1102 are between the gate dielectric layer 1202 and the channel layers 406. In other words, the gate dielectric layer 1202 is separated from the channel layers 406 by the interfacial layers 1102. In some embodiments, a thickness of the gate dielectric layer 1202 wrapping around the channel layer 406A and the channel layer 406B is in a range from about 1 nm to about 2.5 nm.

The gate dielectric layer 1202 may include a dielectric material having a dielectric constant greater than a dielectric constant of SiO$_2$, which is approximately 3.9. For example, the gate dielectric layer 1202 may include hafnium oxide (HfO$_2$), which has a dielectric constant in a range from about 9 to about 40. Alternatively, the gate dielectric layers 1406 may include other high-K dielectrics, such as TiO$_2$, HfZrO, Ta$_2$O$_3$, HfSiO$_4$, ZrO$_2$, ZrSiO$_2$, LaO, AlO, ZrO, TiO, Ta$_2$O$_5$, Y$_2$O$_3$, SrTiO$_3$ (STO), BaTiO$_3$ (BTO), BaZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), combinations thereof, or other suitable material. The gate dielectric layer 1202 may be formed by ALD, PVD, CVD, oxidation, and/or other suitable methods.

Figures 18, 19:
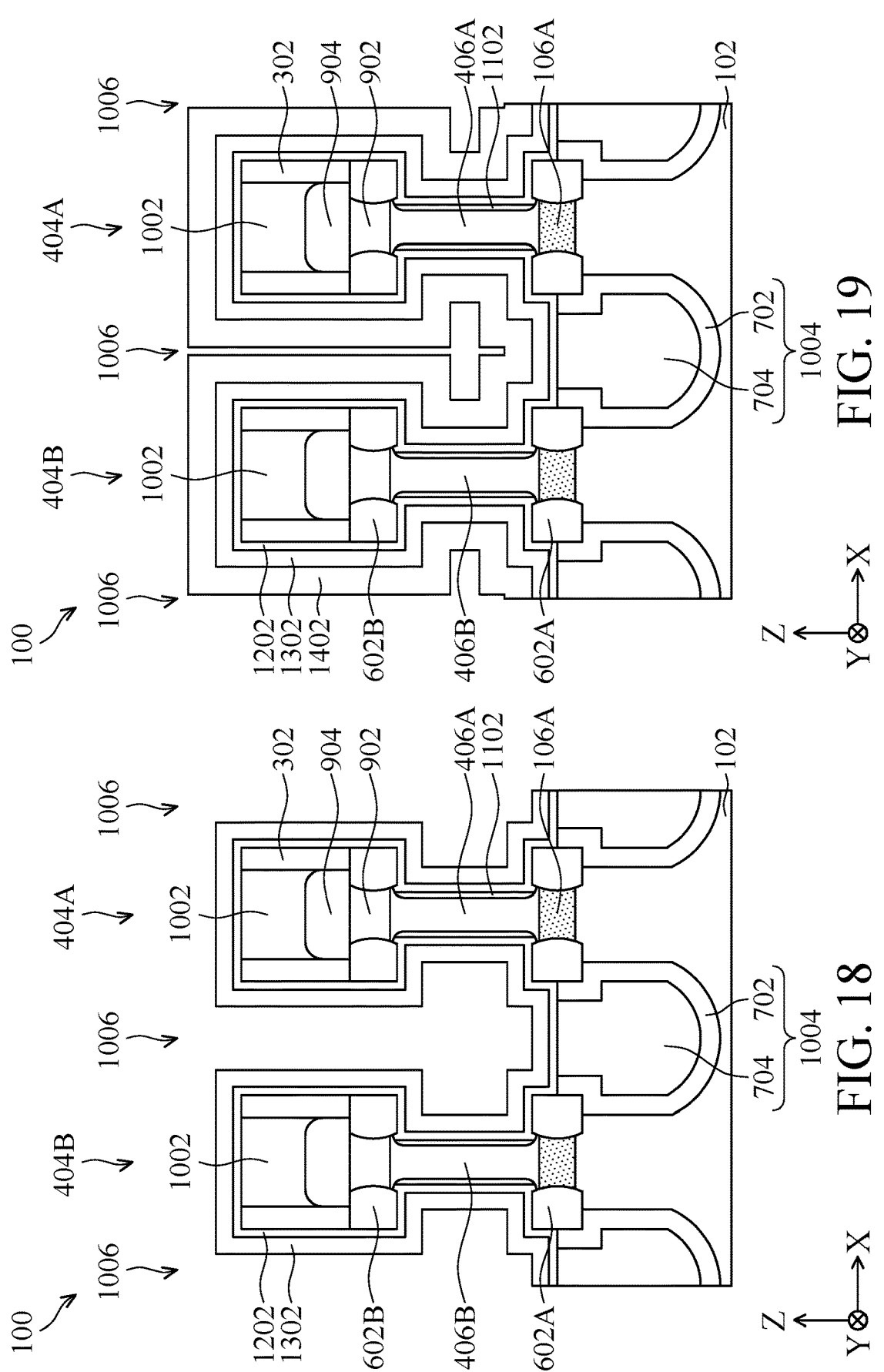

Referring to FIG. 18, a work function layer 1302 is formed to wrap around the gate dielectric layer 1202 in the regions 404A and 404B. More specifically, the work function layer 1302 is conformally formed on the gate dielectric layer 1202. As such, the work function layer 1302 wraps around the gate dielectric layer 1202, the interfacial layers 1102, and the channel layers 406, as shown in FIG. 18. In some embodiments, a thickness of the work function layer 1302 is in a range from about 1 nm to about 4 nm.

The work function layer 1302 includes a metal material, such as Al, W, Co, Ni, Ti, TiAl, TiAlC, TiN, WCN, other suitable metal materials. Therefore, the work function layer 1302 may be referred to as a work function metal layer.

In some embodiments, the work function layer 1302 includes n-type work function metal layer. In an embodiment, the n-type work function metal layer is a material such as Ti, Al, Ag, Mn, Zr, TiAl, TiAlC, TaC, TaCN, TaSiN, TaAl, TaAlC, TiAlN, other suitable n-type work function materials, or combinations thereof. For example, the n-type work function metal layer may be deposited utilizing ALD, CVD, or the like. However, any suitable materials and processes may be utilized to form the n-type work function metal layer.

In some embodiments, the work function layer 1302 includes p-type work function metal layer. In an embodiment, the p-type work function metal layer may be a material such as TiN, TaN, Ru, Mo, Al, WN, ZrSi$_2$, MoSi$_2$, TaSi$_2$, NiSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, other suitable p-type work function materials, combinations of these, or the like. Additionally, the p-type work function metal layer may be deposited using a deposition process such as ALD, CVD, or the like, although any suitable deposition process may be used.

Referring to FIG. 19, a hard mask layer 1402 is formed in the regions 404A and 404B to wrap around the work function layer 1302. More specifically, hard mask layer 1402 is conformally formed on the work function layer 1302. As such, hard mask layer 1402 wraps around the work function layer 1302, the gate dielectric layer 1202, the interfacial layers 1102, and the channel layers 406, as shown in FIG. 19.

The hard mask layer 1402 may be a single layer or a multi-layer. In some embodiments, the hard mask layer 1402 is a single layer and includes a nitride layer, such as silicon nitride. In some embodiments, the hard mask layer 1402 is a multi-layer and includes a silicon nitride layer and a silicon oxide layer over the silicon nitride layer. In some embodiments, the deposition process for forming the dielectric material of the hard mask layers 1402 includes ALD, CVD, LPCVD, plasma-enhanced CVD (PECVD), a combination thereof, or the like, may also be utilized.

Figures 20, 21:
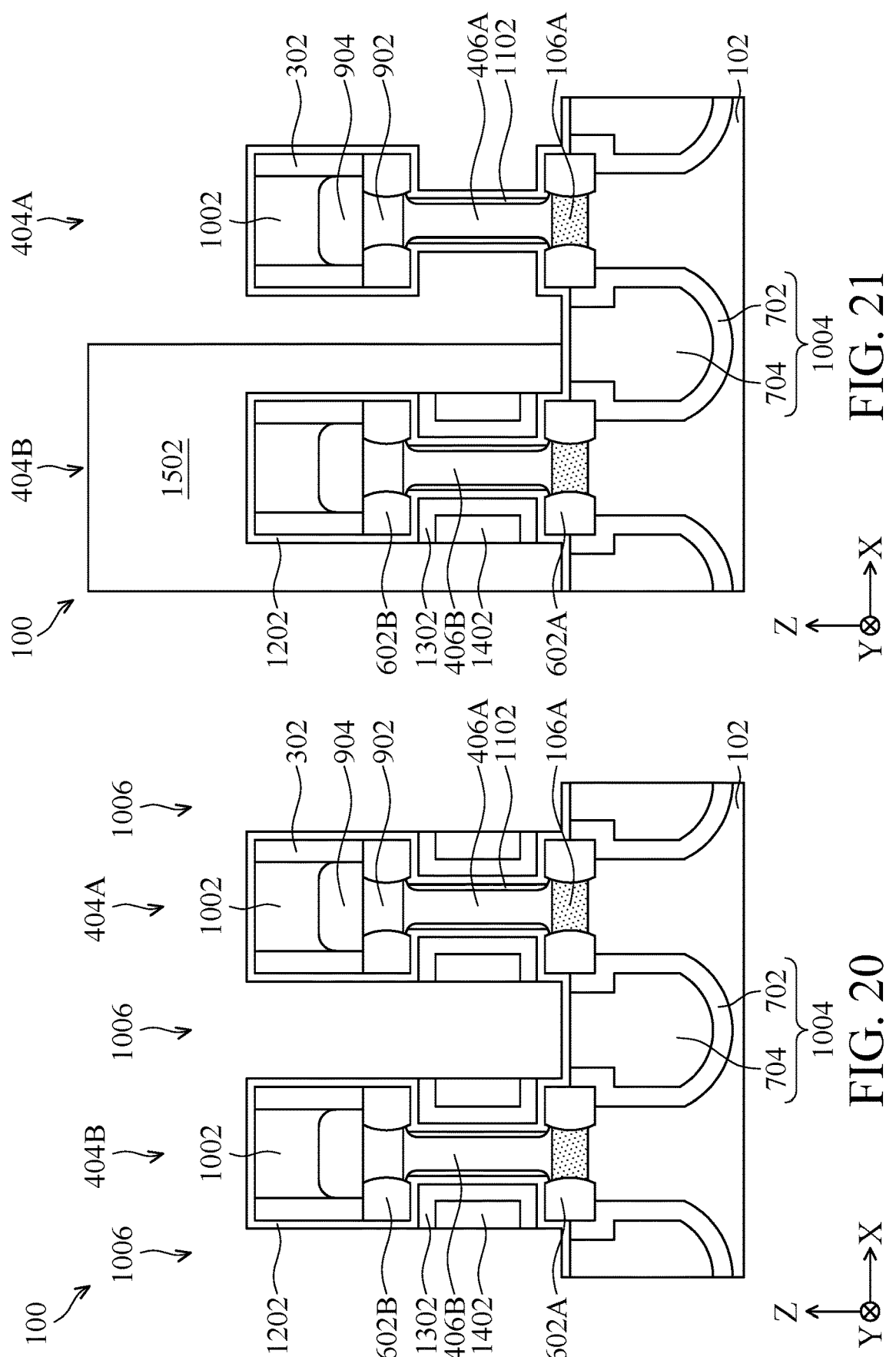

Referring to FIG. 20, portions of the work function layer 1302 and the hard mask layer 1402 are removed. More specifically, the portions of the work function layer 1302 and the hard mask layer 1402 directly over the isolation structure 1004 and in the trenches 1006 are removed by performing an etching process. In some embodiments, the etching process is a selective etching process that selectively etches the work function layer 1302 and the hard mask layer 1402, with minimal (or no) etching of the gate dielectric layer 1202. The etching process is also an anisotropic etching process, such that (other portions of) the work function layer 1302 and the hard mask layer 1402 directly below the top spacers 302, the upper inner spacers 602B, and the gate dielectric layer 1202 remain. In some embodiments, the remaining work function layer 1302 and the remaining hard mask layer 1402 are vertically between the upper inner spacers 602B and the lower inner spacers 602A in the Z-direction. In some aspects, the remaining work function layer 1302 and the remaining hard mask layer 1402 are vertically between gate dielectric layer 1202.

The removal of the portions of the work function layer 1302 and the hard mask layer 1402 makes the spaces of the trenches 1006 are enlarged, such that the process window for subsequent processes are increased. After the removal of the portions of the work function layer 1302 and the hard mask layer 1402, the gate dielectric layer 1202 on the sidewalls of the upper inner spacers 602B, the lower inner spacers 602A, and the top spacers 302 are exposed in the trenches 1006, as shown in FIG. 20. In some aspects, the extending portions of the gate dielectric layer 1202 covering and on the sidewalls of the upper inner spacers 602B, the lower inner spacers 602A, and the top spacers 302 discussed above are exposed in the trenches 1006.

Referring to FIG. 21, the work function layer 1302 and the hard mask layer 1402 in the region 404A are removed. More specifically, the work function layer 1302 and the hard mask layer 1402 wrapping around the channel layer 406A in the region 404A are removed by performing one or more lithography and etching processes. In some embodiments, the lithography and etching processes may include forming a photoresist layer 1502 in the regions 404A and 404B to cover (or wrap around) the gate dielectric layer 1202, the work function layer 1302, and the hard mask layer 1402, exposing the photoresist layer 1502 to a pattern corresponding to the region 404A, performing a post-exposure bake process, and developing the photoresist layer 1502 to form an opening, which exposes the gate dielectric layer 1202, work function layer 1302, and the hard mask layer 1402 in the region 404A. Then, the portions of the work function layer 1302 and the hard mask layer 1402 exposed by the opening (or in the region 404A) of the photoresist layer 1502 are removed while the portions of the work function layer 1302 and the hard mask layer 1402 covered in the region 404B by the photoresist layer 1502 remain.

The portions of the work function layer 1302 and the hard mask layer 1402 in the region 404A are removed by one or more etching processes. In some embodiments, the etching processes are selective etching processes that selectively etch the work function layer 1302 and the hard mask layer 1402, with minimal (or no) etching of the gate dielectric layer 1202. In some embodiments, two etching processes are designed to target the materials of the work function layer 1302 and the hard mask layer 1402, respectively. For example, a first etching process (such as a wet etching or a plasma etching) is performed to laterally etch and remove the hard mask layer 1402. Then, a second etching process (such as another wet etching or another plasma etching) is performed to laterally etch and remove the work function layer 1302. The first and the second etching processes are designed to laterally etch the work function layer 1302 and the hard mask layer 1402 by isotropic plasma etching or chemical etching.

Figures 22, 23:
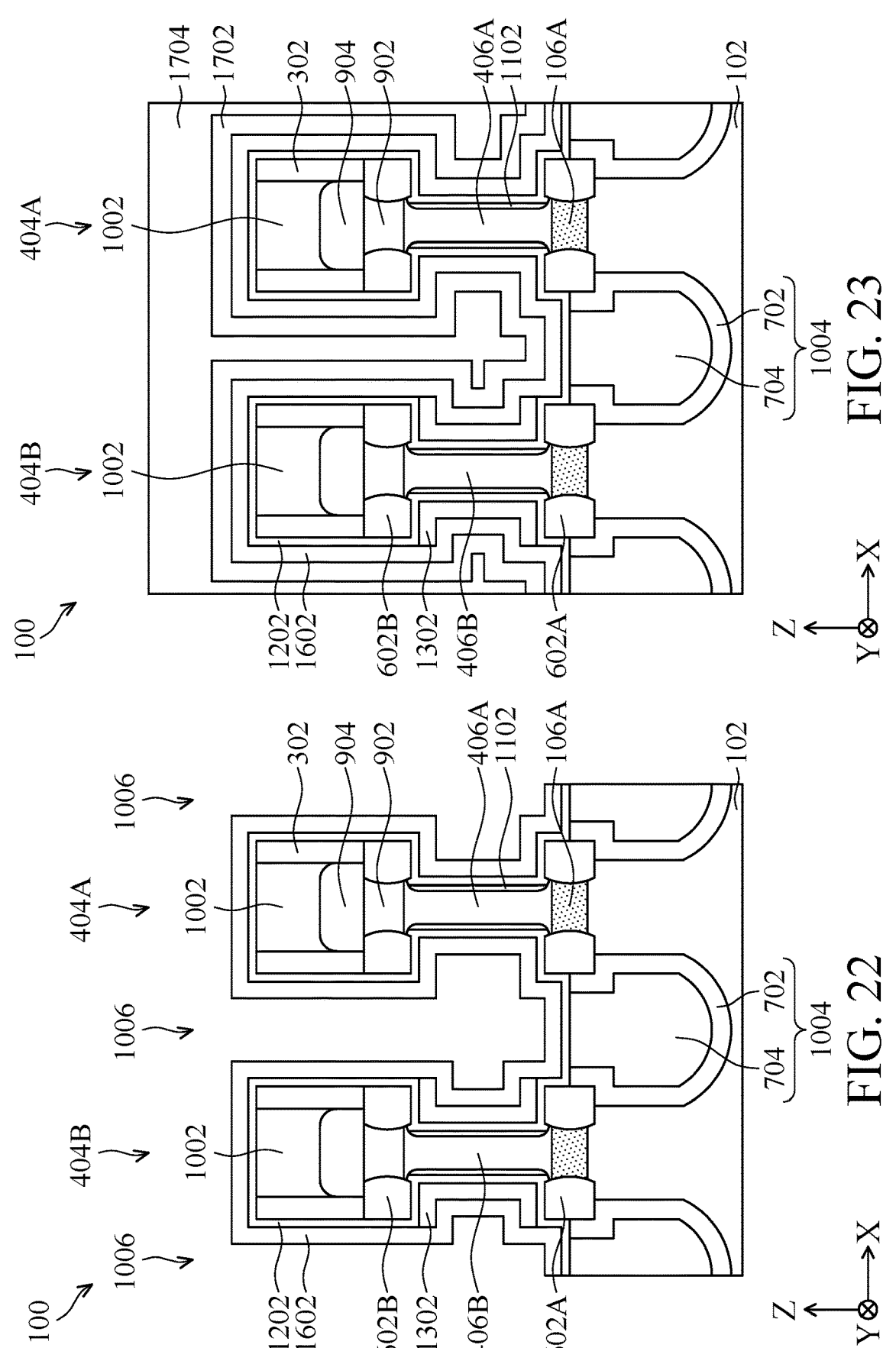

Referring to FIG. 22, the photoresist layer 1502 and the hard mask layer 1402 in the region 404B are removed, and a work function layer 1602 is then formed in the region 404A and 404B. More specifically, the photoresist layer 1502 covering the region 404B is removed, and the hard mask layer 1402 wrapping around the work function layer 1302 and the channel layer 406B in the region 404B are then removed by performing an etching process. In some embodiments, the etching process is a selective etching process that selectively etches the hard mask layer 1402, with minimal (or no) etching of the gate dielectric layer 1202 and the work function layer 1302.

After the removal of the photoresist layer 1502 and the hard mask layer 1402 in the region 404B, the work function layer 1602 is conformally formed on the gate dielectric layer 1202 in the regions 404A and 404B and the work function layer 1302 in the region 404B. As such, the work function layer 1602 wraps around the work function layer 1302, the gate dielectric layer 1202, the interfacial layers 1102, and the channel layer 406B in the region 404B, and wraps around the gate dielectric layer 1202, the interfacial layers 1102, and the channel layer 406B in the region 404A, as shown in FIG. 22. In some embodiments, a thickness of the work function layer 1302 is in a range from about 1 nm to about 4 nm.

As discussed above, the gate dielectric layer 1202 on the sidewalls of the upper inner spacers 602B, the lower inner spacers 602A, and the top spacers 302 are exposed in the trenches 1006. Therefore, the work function layer 1602 is also formed on and in contact with the gate dielectric layer 1202 on the sidewalls of the upper inner spacers 602B, the lower inner spacers 602A, and the top spacers 302 in the regions 404A and 404B. In some aspects, the work function layer 1602 extends onto the sidewalls of the upper inner spacers 602B, the lower inner spacers 602A, and the top spacers 302 to be in contact with the extending portions of the gate dielectric layer 1202 covering the sidewalls of the upper inner spacers 602B, the lower inner spacers 602A, and the top spacers 302 discussed above.

The work function layer 1602 includes a metal material, such as Al, W, Co, Ni, Ti, TiAl, TiAlC, TIN, WCN, other suitable metal materials. Therefore, the work function layer 1602 may be referred to as a work function metal layer.

In some embodiments, the work function layer 1602 includes n-type work function metal layer. In an embodiment, the n-type work function metal layer is a material such as Ti, Al, Ag, Mn, Zr, TiAl, TiAlC, TaC, TaCN, TaSiN, TaAl, TaAlC, TiAlN, other suitable n-type work function materials, or combinations thereof. For example, the n-type work function metal layer may be deposited utilizing ALD, CVD, or the like. However, any suitable materials and processes may be utilized to form the n-type work function metal layer.

In some embodiments, the work function layer 1602 includes p-type work function metal layer. In an embodiment, the p-type work function metal layer may be a material such as TiN, TaN, Ru, Mo, Al, WN, $ZrSi_2$, $MoSi_2$, $TaSi_2$, $NiSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, other suitable p-type work function materials, combinations of these, or the like. Additionally, the p-type work function metal layer may be deposited using a deposition process such as ALD, CVD, or the like, although any suitable deposition process may be used.

Referring to FIG. 23, a glue layer 1702 and a metal material 1704 are formed to fill the trenches 1006 in the regions 404B and 404A. The glue layer 1702 is conformally formed on the work function layer 1602. In some aspects, the glue layer 1702 wraps around the work function layer 1602, the work function layer 1302, the gate dielectric layer 1202, the interfacial layers 1102, and the channel layer 406B in the region 404B, and wraps around the work function layer 1602, the gate dielectric layer 1202, the interfacial layers 1102, and the channel layer 406B in the region 404A, as shown in FIG. 23. In some embodiments, The glue layer 1702 may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The metal material 1704 is then formed on the glue layer 1702 to fill the remaining spaces between the glue layer 1702 in the trenches 1006 and over the glue layer 1702. In some aspects, the metal material 1704 is formed inside the glue layer 1702. In some embodiments, the metal material 1704 is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the metal material 1704 is formed using CVD, PVD, ALD, electroplating, another applicable method, or a combination thereof.

Figures 24, 25:
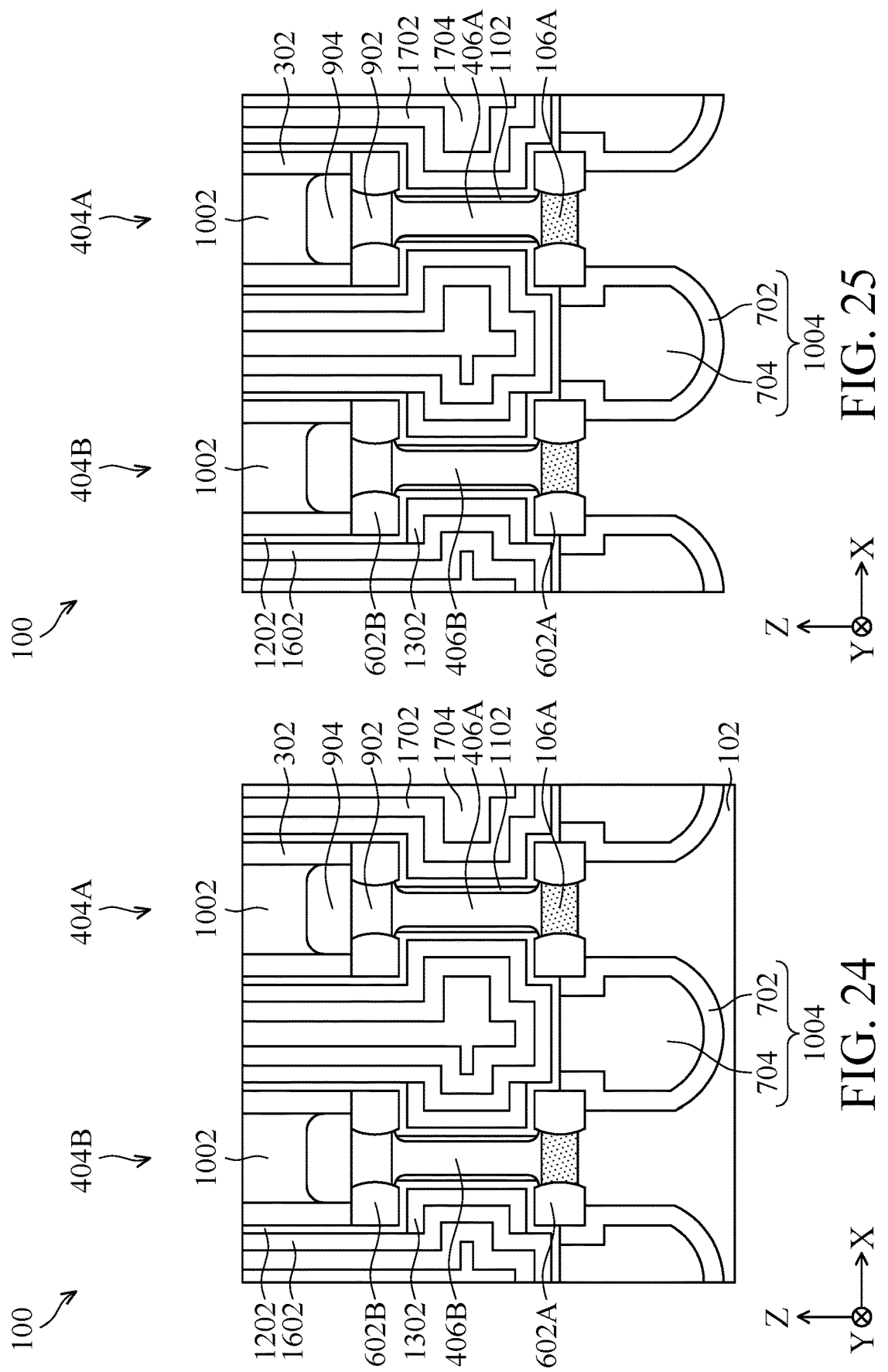

Referring to FIG. 24, a planarization process, such as a CMP process, is performed on the glue layer 1702 and the metal material 1704 to remove portions of the glue layer 1702, the metal material 1704, and the gate dielectric layer 1202 over the hard mask layers 1002 and the top spacers 302 until the top surfaces of the hard mask layers 1002 and the top spacers 302 are exposed. As shown in FIG. 24, the metal material 1704 wraps around the glue layer 1702, the work function layer 1602, the work function layer 1302, the gate dielectric layer 1202, the interfacial layers 1102, and the channel layer 406B in the region 404B, and wraps around the glue layer 1702, the work function layer 1602, the gate dielectric layer 1202, the interfacial layers 1102, and the channel layer 406B in the region 404A. In some embodiments, the metal material 1704, the glue layer 1702, the work function layer 1602, the work function layer 1302 in the regions 404A and 404B may be collectively referred to as a gate electrode. Further, the metal material 1704 inside the glue layer 1702 (or between the channel layers 406) in the X-Z cross-sectional view shown in FIG. 24 is asymmetric about a Z-axis (parallel to the Z-direction).

After the planarization process, the workpiece 100 may be flipped to form subsequent features. For the purpose of simplicity, the sequent figures are shown without being flipped. Referring to FIG. 25, the substrate 102 (which directly under the source/drain features 802-1) are removed by performing one or more etching processes on bottom surfaces of the substrate 102 (or on back-side of the substrate 102) to form openings 1706. The etching process is a selective etching process that selectively etches the substrate 102, with minimal (or no) etching of the isolation structure 1004 (more specifically, the liner layer 702), the lower inner spacers 602A, and the semiconductor layer 106A, such that the openings 1706 are formed. The selective etching process is a dry etching process, a wet etching process, other suitable etching process, or combinations thereof. As such, bottom surfaces of the isolation structure 1004 (more specifically, the liner layer 702), the lower inner spacers 602A, and the semiconductor layer 106A are exposed. In some aspects, the bottom surfaces of the semiconductor layer 106A, (portions of) the bottom surfaces of the lower inner spacers 602A, and sidewalls of the isolation structure 1004 (more specifically, the liner layer 702) are exposed in the openings 1706, as shown in FIG. 25.

Referring to FIG. 26, the semiconductor layer 106A is removed by performing an etching process. The etching process is a selective etching process that selectively etches the semiconductor layer 106A, with minimal (or no) etching of the isolation structure 1004 (more specifically, the liner layer 702), the lower inner spacers 602A, and the channel layers 406, such that bottom surfaces of the channel layers 406 and the (convex) sidewalls of the lower inner spacers 602A are exposed in the openings 1706.

Referring to FIG. 27, lightly doped drain (LDD) features 1802 are formed in the openings 1706, and source/drain features 1804 are formed under the LDD features 1802. The LDD features 1802 have concave sidewalls due to the convex sidewalls of the lower inner spacers 602A. In some embodiments, the LDD features 1802 are formed between and in contact with the lower inner spacers 602A. In some aspects, the lower inner spacers 602A are around the LDD features 1802. As shown in FIG. 27, bottom surfaces of the LDD features 1802 are substantially level with the bottom surfaces of the lower inner spacers 602A. In some embodiments, the bottom surfaces of LDD features 1802 are higher than the bottom surfaces of the lower inner spacers 602A. In some embodiments, the LDD features 1802 are formed under and electrically connected to the channel layers 406. As shown in FIG. 27, top surfaces of the LDD features 1802 are in contact with the bottom ends of the channel layers 406. Therefore, the LDD features 1802 may also be referred to as bottom LDD features. In some embodiments, the top surfaces of the LDD features 1802 are lower than the top surfaces of the lower inner spacers 602A.

The source/drain features 1804 have convex bottom surfaces, as shown in FIG. 27. In some embodiments, the source/drain features 1804 are formed between and in contact with the isolation structure 1004 (more specifically, the liner layer 702). In some aspects, the isolation structure 1004 is around the source/drain features 1804. As shown in FIG. 27, topmost surfaces of the source/drain features 1804 are substantially level with the bottom surfaces of the lower inner spacers 602A. In some embodiments, the topmost surfaces of the source/drain features 1804 are higher than the bottom surfaces of the lower inner spacers 602A. In some embodiments, the source/drain features 1804 are formed under and electrically connected to the channel layers 406 and the LDD features 1802. As shown in FIG. 27, top surfaces of the source/drain features 1804 are in contact with the bottom surfaces of the LDD features 1802 and the lower inner spacers 602A. Therefore, the source/drain features 1804 may also be referred to as bottom source/drain features.

One or more epitaxy processes may be employed to grow the LDD features 1802 and the source/drain features 1804. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The LDD features 1802 and the source/drain features 1804 may include any suitable semiconductor materials.

For example, the LDD features 1802 and the source/drain features 1804 for n-type VGAA transistors may include epitaxially-grown material selected from a group consisting of SiP, SiC, SiPC, SiAs, Si, or a combination thereof. In some embodiments, the epitaxially-grown material of the LDD features 1802 and the source/drain features 1804 may be doped with n-type dopants (such as phosphorus, arsenic, other n-type dopant, or combinations thereof). In some embodiments, the LDD features 1802 and the source/drain features 1804 for n-type VGAA transistors may be respectively referred to as n-type LDD features and n-type source/drain features.

In another example, the LDD features 1802 and the source/drain features 1804 for p-type VGAA transistors may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the LDD features 1802 and the source/drain features 1804 may be doped with p-type dopants (such as boron, indium, other p-type dopant, or combinations thereof). In some embodiments, the LDD features 1802 and the source/drain features 1804 for p-type VGAA transistors may be respectively referred to as p-type LDD features and p-type source/drain features.

The source/drain features 1804 may also be referred to as source/drain, or source/drain regions. In some embodiments, the source/drain features 1804 may refer to a source or a drain, individually or collectively dependent upon the context. The LDD features 1802 and the source/drain features 1804 may be doped in-situ or ex-situ. One or more annealing processes may be performed to activate the dopants in the LDD features 1802 and the source/drain features 1804. The annealing processes may include rapid thermal annealing (RTA) and/or laser annealing processes.

Still referring to FIG. 27, hard mask layers 1806 are formed under the source/drain features 1804. In order to form the hard mask layers 1806, a deposition process forms a dielectric material into the openings 1706 and under the liner layer 702, the isolation material 704, and the source/drain features 1804. A planarization process (e.g., a chemical mechanical polishing (CMP) process) is then performed on the dielectric material until the bottom surfaces of the liner layer 702 and the isolation material 704 are exposed, thereby the remaining dielectric material in the openings 1706 are formed into the hard mask layers 1806. In some embodiments, bottom portions of the liner layer 702 and the isolation material 704 are removed, such that heights of the liner layer 702 and the isolation material 704 are reduced during the planarization process, as shown in FIG. 27. The hard mask layers 1806 have concave top surfaces due to the convex bottom surfaces of the source/drain features 1804. In some embodiments, the hard mask layers 1806 are formed between and in contact with the liner layer 702. In some aspects, the liner layer 702 is around the hard mask layers 1806. The hard mask layers 1806 each may be a single layer or a multi-layer. In some embodiments, each of the hard mask layers 1806 is a single layer and includes a nitride layer, such as silicon nitride. In some embodiments, each of the hard mask layers 1806 is a multi-layer and includes a silicon nitride layer and a silicon oxide layer over the silicon nitride layer. In some embodiments, the deposition process for forming the dielectric material of the hard mask layers 1806 includes CVD, LPCVD, plasma-enhanced CVD (PECVD), a combination thereof, or the like, may also be utilized.

After the formation of the hard mask layers 1806, VGAA transistors 1902A and 1902B are formed and completed in the workpiece 100. It should be noted that more features may be formed over or under the VGAA transistors 1902A and 1902B. For example, a front-side interconnection structure including interlayer dielectric (ILD) layers with vias and metal conductors is formed over the workpiece 100 to form one or more interconnections that are electrically connected to the source/drain features 904 or the metal material 1704. Furthermore, a bottom-side interconnection structure including interlayer dielectric (ILD) layers with vias and metal conductors is formed under the workpiece 100 to form an interconnection that is electrically connected to the source/drain features 1804.

FIG. 28 is a top view of the workpiece 100 at a fabrication stage, in accordance with some embodiments of the present disclosure. Since the channel layer 406A of the VGAA transistor 1902A is wrapped around by one work function layer (e.g., the work function layer 1602) and the channel layer 406B of the VGAA transistor 1902B is wrapped around by two work function layer (e.g., the work function layers 1302 and 1602), the VGAA transistors 1902A and 1902B have different threshold voltages, thereby different applications of the transistors can be designed on the workpiece 100. It is noted that the work function layer 1302 in the VGAA transistor 1902B is vertically between the upper inner spacer 602B and the lower inner spacer 602A without on the gate dielectric layer 1202 on the sidewalls of the upper inner spacers 602B, the lower inner spacers 602A, and the top spacers 302 due to the removal of the portions of the work function layer 1302 and the hard mask layer 1402 on the extending portions of the gate dielectric layer 1202 discussed above. Therefore, the VGAA transistors 1902A and 1902B have the same footprint although the VGAA transistor 1902B has two work function layers.

Referring to FIG. 28, the VGAA transistors 1902A and 1902B have the same footprint. More specifically, in the top view, the hard mask layers 1002 of the VGAA transistors 1902A and 1902B are surrounded (wrapped around) by the top spacers 302, the top spacers 302 of the VGAA transistors 1902A and 1902B are surrounded (wrapped around) by the gate dielectric layer 1202. However, in the top view, the gate dielectric layer 1202 of the VGAA transistor 1902B is surrounded (wrapped around) by the work function layer 1602 (same as the gate dielectric layer 1202 of the VGAA transistor 1902A), rather than being surrounded (wrapped around) by the work function layer 1302. Therefore, the VGAA transistors 1902A and 1902B have the same footprint. The work function layer 1302 of the VGAA transistor 1902B does not affect or increase the footprint of the VGAA transistor 1902B, thereby the VGAA transistor 1902B with more work function layers and different threshold voltage can be designed without reducing the device density.

Figures 29A, 29B:
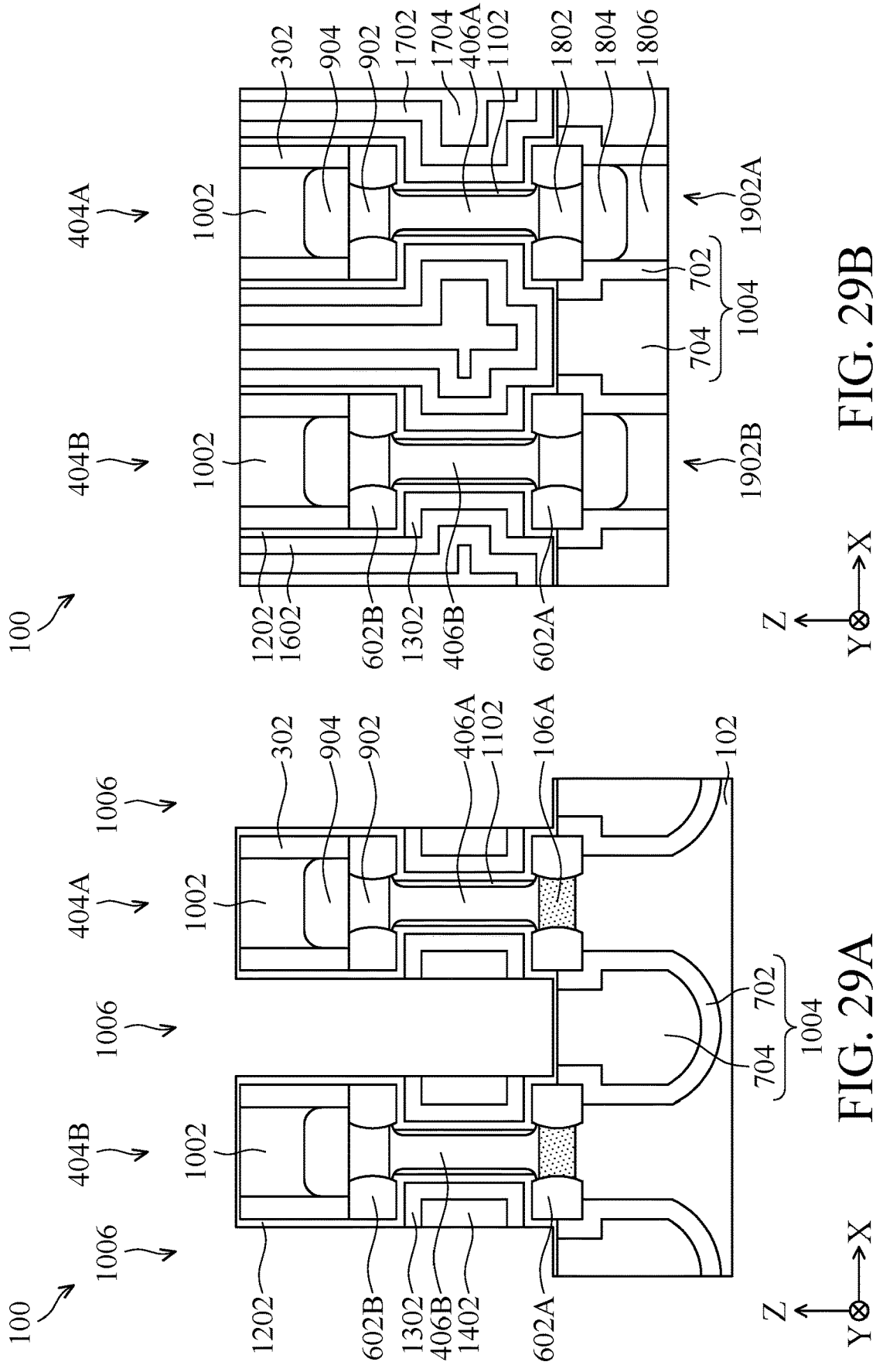
FIGS. 29A and 30A are X-Z cross-sectional views of the workpiece at the fabrication stage corresponding to FIG. 20 and along lines A-A' of FIGS. 1 and 2, in accordance with some embodiments of the present disclosure.
FIGS. 29B and 30B are X-Z cross-sectional views of the workpiece at the fabrication stage corresponding to FIG. 27 and along lines A-A' of FIGS. 1, 2, and 28, in accordance with some embodiments of the present disclosure.
Figures 30A, 30B:
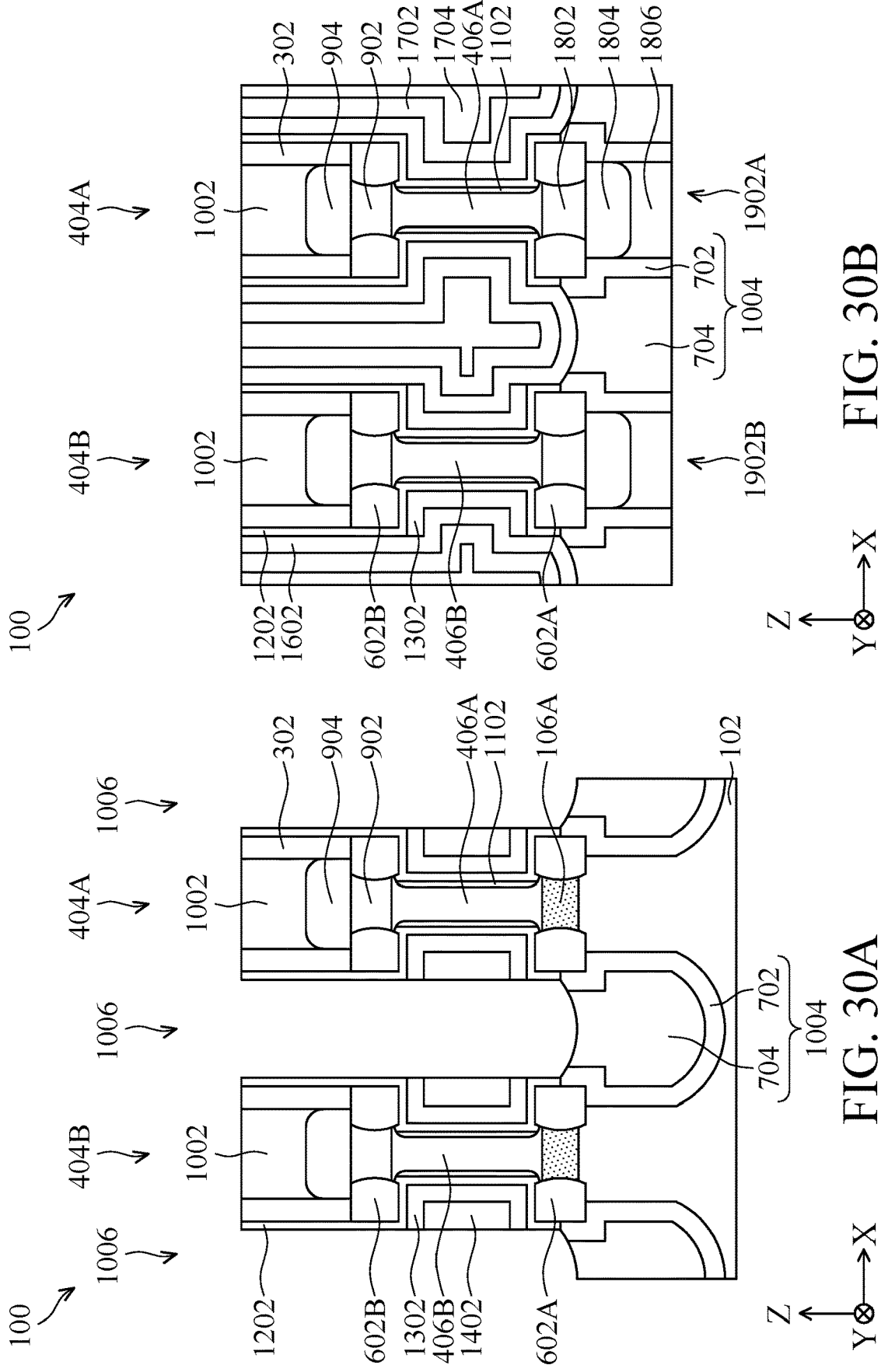

FIGS. 29A and 30A are X-Z cross-sectional views of the workpiece 100 at the fabrication stage corresponding to FIG. 20 and along lines A-A' of FIGS. 1 and 2, in accordance with some embodiments of the present disclosure. FIGS. 29B and 30B are X-Z cross-sectional views of the workpiece 100 at the fabrication stage corresponding to FIG. 27 and along lines A-A' of FIGS. 1, 2, and 28, in accordance with some embodiments of the present disclosure.

Referring to FIG. 29A, during the removal of the portions of the work function layer 1302 and the hard mask layer 1402 directly over the isolation structure 1004, portions of the gate dielectric layer 1202 over the isolation structure 1004, the hard mask layers 1002, and the top spacers 302 are removed. In other words, a thickness of the gate dielectric layer 1202 over the isolation structure 1004, the hard mask layers 1002, and the top spacers 302 are reduced. Therefore, after subsequent processes similar to that described above is performed to FIG. 29A, in the resultant structure shown in FIG. 29B, the thickness of the gate dielectric layer 1202 over the isolation structure 1004 is less than a thickness of the gate dielectric layer 1202 wrapping around the channel layers 406.

Referring to FIG. 30A, during the removal of the portions of the work function layer 1302 and the hard mask layer 1402 directly over the isolation structure 1004, the gate dielectric layer 1202 over the isolation structure 1004, the hard mask layers 1002, and the top spacers 302 are fully removed. In other words, the top surfaces of the isolation structure 1004 are exposed in the trenches 1006. In some embodiments, the isolation structure 1004 has concave top surfaces after the removal of the portions of the work function layer 1302 and the hard mask layer 1402, as shown in FIG. 30A. Therefore, after subsequent processes similar to that described above is performed to FIG. 30A, in the resultant structure shown in FIG. 30B, the work function layer 1602 is in contact with the isolation structure 1004. Further, the 1602, the glue layer 1702, and the metal material 1704 each has convex bottom surfaces due to the concave top surfaces of the isolation structure 1004. As such, the thickness of the gate dielectric layer 1202 over the isolation structure 1004 is in a range from about 0 nm to about 2.5 nm, in some embodiments.

In some embodiments, dipole layers are further formed between the interfacial layers 1102 and the work function layer 1302 to adjust the threshold voltage of the transistors. FIGS. 31A to 31F are X-Z cross-sectional views of the workpiece 100 at various fabrication stages for forming the dipole layers along lines A-A' of FIGS. 1 and 2, in accordance with some embodiments of the present disclosure.

Figures 31A, 31B:
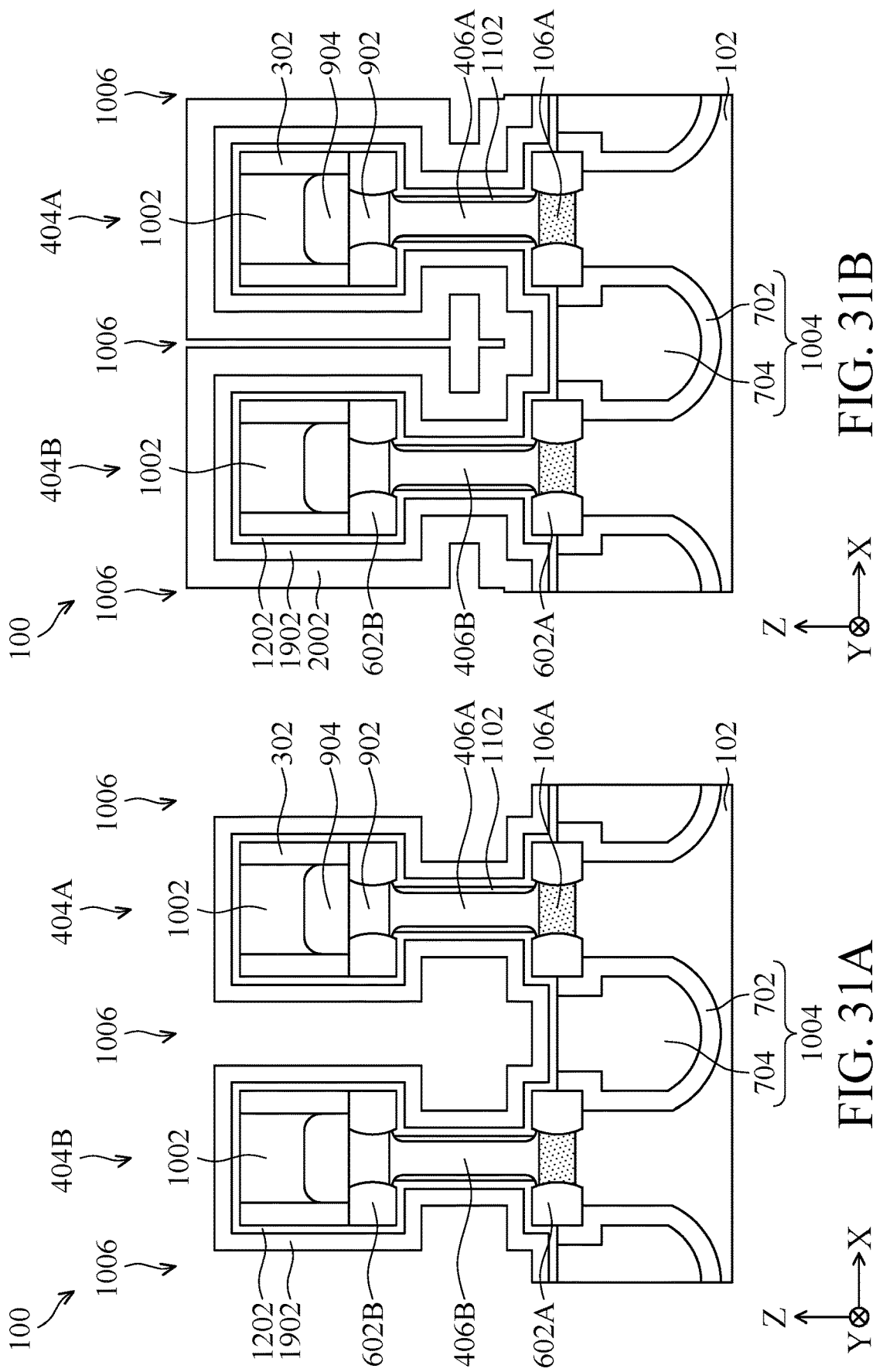

Referring to FIG. 31A, after the formation of the gate dielectric layer 1202 (referring to FIG. 17), a dipole material 1902 is formed to wrap around the gate dielectric layer 1202 in the region 404A and 404B. More specifically, the dipole material 1902 is conformally formed on the gate dielectric layer 1202. As such, the dipole material 1902 wraps around the gate dielectric layer 1202, the interfacial layers 1102, and the channel layers 406, as shown in FIG. 31A. The work function layer 1302 is made of $AlO_x$, $TiO_x$, ZnO, $NiO_x$, $LaO_x$, $SrO_x$, TiAl, other suitable metal materials.

Referring to FIG. 31B, a hard mask layer 2002 is formed in the region 404A and 404B to wrap around the dipole material 1902. More specifically, hard mask layer 2002 is conformally formed on the dipole material 1902. As such, hard mask layer 2002 wraps around the dipole material 1902, the gate dielectric layer 1202, the interfacial layers 1102, and the channel layers 406, as shown in FIG. 31B.

The hard mask layer 2002 may be a single layer or a multi-layer. In some embodiments, the hard mask layer 2002 is a single layer and includes a nitride layer, such as silicon nitride. In some embodiments, the hard mask layer 2002 is a multi-layer and includes a silicon nitride layer and a silicon oxide layer over the silicon nitride layer. In some embodiments, the deposition process for forming the dielectric material of the hard mask layers 2002 includes ALD, CVD, LPCVD, plasma-enhanced CVD (PECVD), a combination thereof, or the like, may also be utilized.

Figures 31C, 31D:
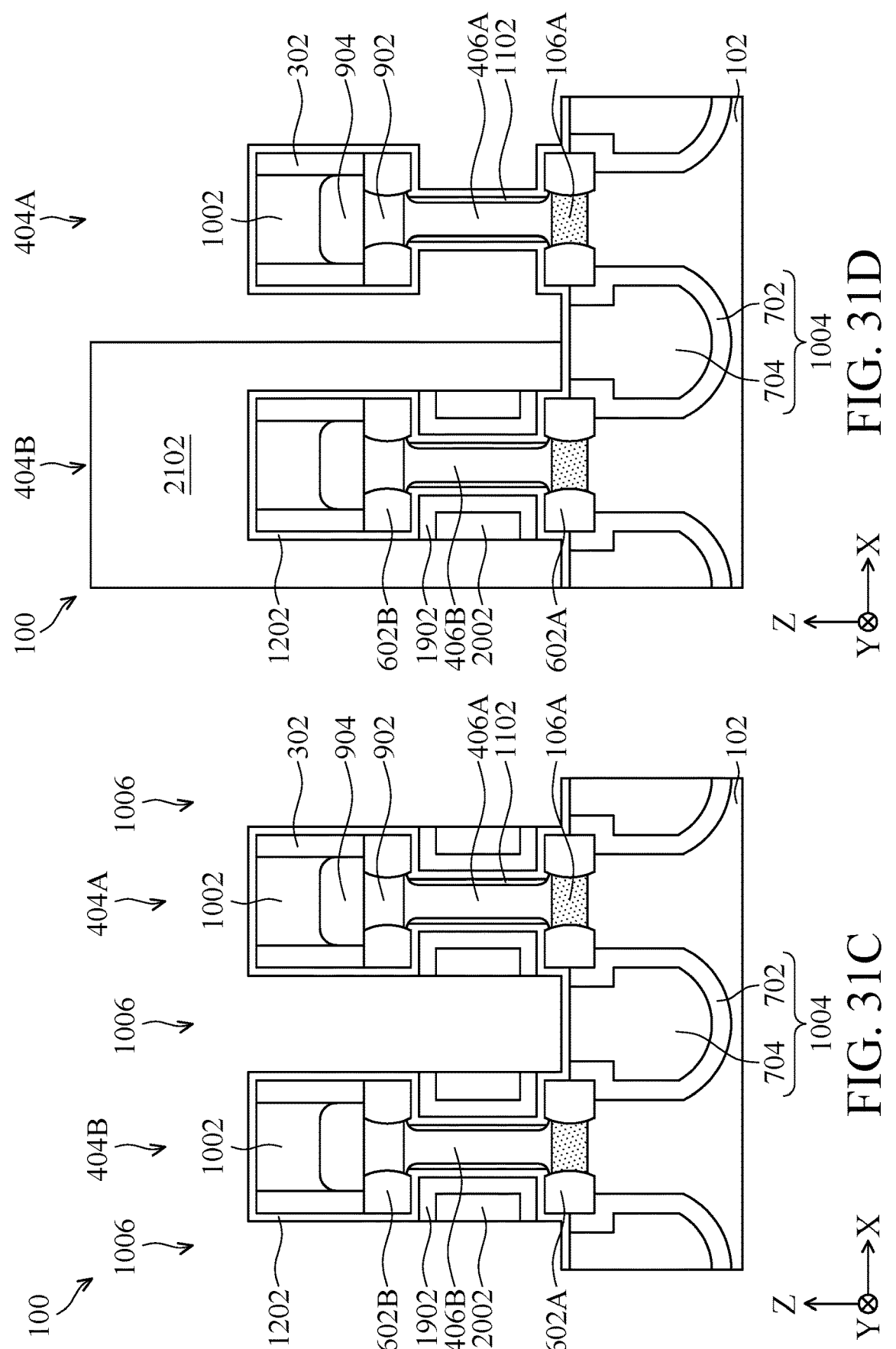

Referring to FIG. 31C, portions of the dipole material 1902 and the hard mask layer 2002 are removed. More specifically, the portions of the dipole material 1902 and the hard mask layer 2002 directly over the isolation structure 1004 and in the trenches 1006 are removed by performing an etching process. In some embodiments, the etching process is a selective etching process that selectively etches the dipole material 1902 and the hard mask layer 2002, with minimal (or no) etching of the gate dielectric layer 1202. The etching process is also an anisotropic etching process, such that (other portions of) the dipole material 1902 and the hard mask layer 2002 directly below the top spacers 302, the upper inner spacers 602B, and the gate dielectric layer 1202 remain. In some embodiments, the remaining dipole material 1902 and the remaining hard mask layer 2002 are vertically between the upper inner spacers 602B and the lower inner spacers 602A in the Z-direction. In some aspects, the remaining dipole material 1902 and the remaining hard mask layer 2002 are vertically between the gate dielectric layer 1202.

The removal of the portions of the dipole material 1902 and the hard mask layer 2002 makes the spaces of the trenches 1006 are enlarged, such that the process window for subsequent processes are increased. After the removal of the portions of the dipole material 1902 and the hard mask layer 2002, the gate dielectric layer 1202 on the sidewalls of the upper inner spacers 602B, the lower inner spacers 602A, and the top spacers 302 are exposed in the trenches 1006, as shown in FIG. 31C.

Referring to FIG. 31D, the dipole material 1902 and the hard mask layer 2002 in the region 404A are removed. More specifically, he dipole material 1902 and the hard mask layer 2002 wrapping around the channel layer 406A in the region 404A are removed by performing one or more lithography and etching processes. In some embodiments, the lithography and etching processes may include forming a photoresist layer 2102 with an opening in the region 404B to cover (or wrap around) the gate dielectric layer 1202, the dipole material 1902, and the hard mask layer 2002 in the region 404B and expose the gate dielectric layer 1202, the dipole material 1902, and the hard mask layer 2002 in the region 404A. Then, the portions of the dipole material 1902 and the hard mask layer 2002 exposed by the opening (or in the region 404A) of the photoresist layer 2102 are removed while the portions of the dipole material 1902 and the hard mask layer 2002 covered in the region 404B by the photoresist layer 2102 remain.

The portions of the dipole material 1902 and the hard mask layer 2002 in the region 404A are removed by one or more etching processes. In some embodiments, the etching processes are selective etching processes that selectively etch the dipole material 1902 and the hard mask layer 2002, with minimal (or no) etching of the gate dielectric layer 1202. In some embodiments, two etching processes are designed to target the materials of the dipole material 1902 and the hard mask layer 2002, respectively. For example, a first etching process (such as a wet etching or a plasma etching) is performed to laterally etch and remove the hard mask layer 2002. Then, a second etching process (such as another wet etching or another plasma etching) is performed to laterally etch and remove the dipole material 1902. The first and the second etching processes are designed to laterally etch the dipole material 1902 and the hard mask layer 2002 by isotropic plasma etching or chemical etching.

Figures 31E, 31F:
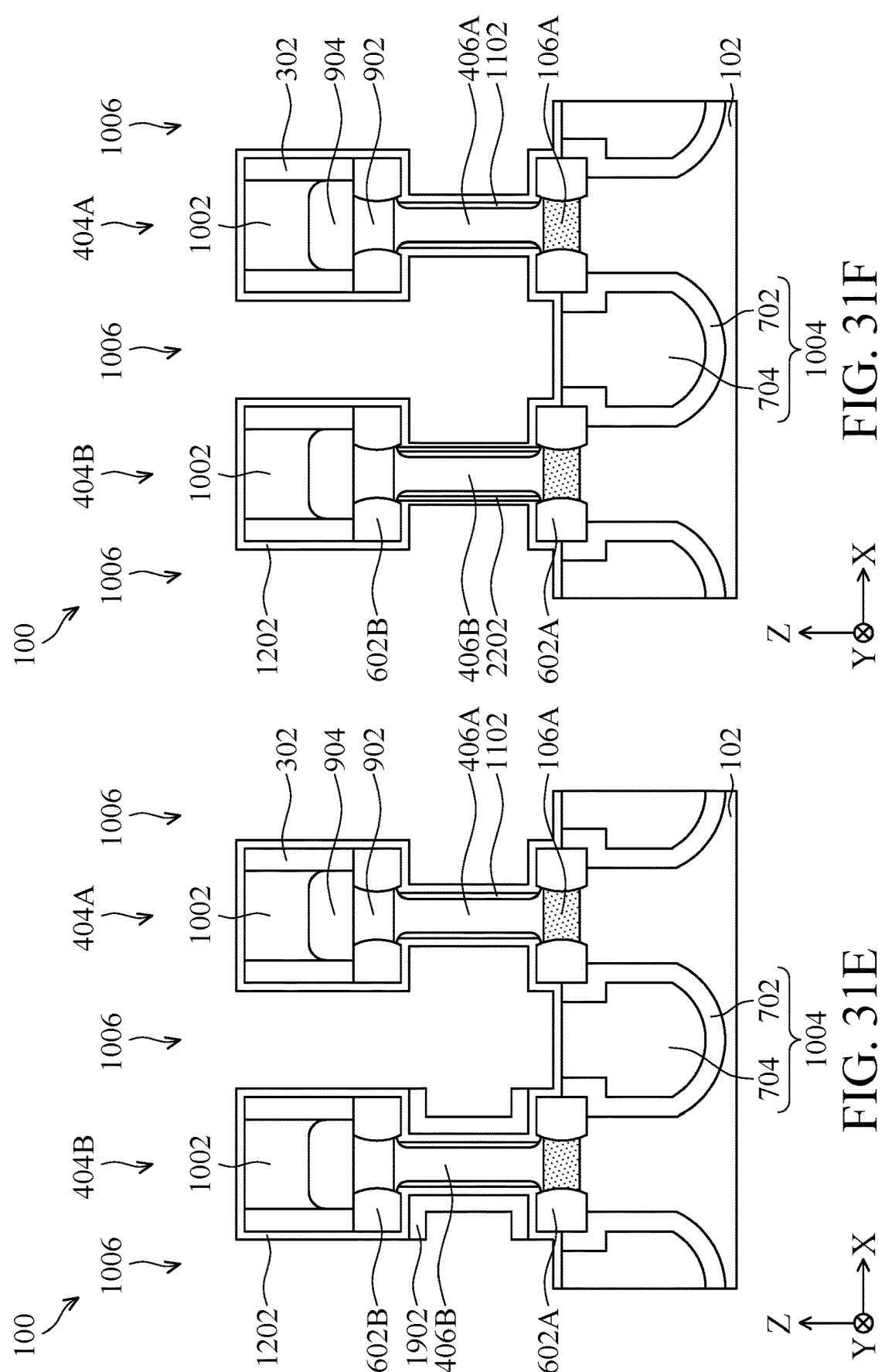

Referring to FIG. 31E, the photoresist layer 2102 and the hard mask layer 2002 in the region 404B are removed. More specifically, the photoresist layer 2102 covering the region 404B is removed, and the hard mask layer 2002 wrapping around the dipole material 1902 and the channel layer 406B in the region 404B are then removed by performing an etching process. In some embodiments, the etching process is selective etching process that selectively etch the hard mask layer 2002, with minimal (or no) etching of the gate dielectric layer 1202 and the dipole material 1902.

Referring to FIG. 31F, the dipole material 1902 in the region 404B is annealed by performing an annealing process, such that elements of the dipole material 1902 diffuse between the interfacial layer 1102 and the gate dielectric layer 1202 in the region 404B to form a dipole layer 2022 between the interfacial layer 1102 and the gate dielectric layer 1202 in the region 404B. As such, the dipole layer 2022 wraps around the interfacial layer 1102 and the channel layer 406B in the region 404B. Further, in this embodiment, the gate dielectric layer 1202 wraps around the dipole layer 2022, the interfacial layer 1102 and the channel layer 406B in the region 404B. After the annealing process, the remaining dipole material 1902 vertically between the upper inner spacers 602B and the lower inner spacers 602A in the Z-direction is removed.

FIGS. 32A to 32C are X-Z cross-sectional views of the workpiece 100 at the fabrication stage corresponding to FIG. 27 and along lines A-A' of FIGS. 1, 2, and 28, in accordance with some embodiments of the present disclosure. After subsequent processes similar to that described above is performed to FIG. 31F, the resultant structure with the VGAA transistors 1902A and 1902B is shown in FIG. 32A. The glue layer 1702 and the metal material 1704 wrap around the work function layer 1602, the gate dielectric layer 1202, the interfacial layer 1102, the channel layer 406A in the region 404A and the work function layer 1602, the work function layer 1302, the gate dielectric layer 1202, the dipole layer 2022, the interfacial layer 1102, the channel layer 406B in the region 404B As such, the channel layer 406A of the VGAA transistor 1902A is wrapped around by one work function layer (e.g., the work function layer 1602) and the channel layer 406B of the VGAA transistor 1902B is wrapped around by the dipole layer 2022 and two work function layer (e.g., the work function layers 1302 and 1602), the VGAA transistors 1902A and 1902B have different threshold voltages, thereby different applications of the transistors can be designed on the workpiece 100.

In some embodiments, the dipole layer 2022 may be formed in the VGAA transistor 1902A in the region 404A. Therefore, as shown in FIG. 32B, the channel layer 406A of the VGAA transistor 1902A is wrapped around by the dipole layer 2022 and one work function layer (e.g., the work function layer 1602) and the channel layer 406B of the VGAA transistor 1902B is wrapped around by two work function layer (e.g., the work function layers 1302 and 1602).

In other embodiments, the dipole layer 2022 may be formed in both the VGAA transistors 1902A and 1902B in the regions 404A and 404B. Therefore, as shown in FIG. 32C, the channel layer 406A of the VGAA transistor 1902A is wrapped around by one dipole layer 2022 and one work function layer (e.g., the work function layer 1602) and the channel layer 406B of the VGAA transistor 1902B is wrapped around by one dipole layer 2022 and two work function layer (e.g., the work function layers 1302 and 1602).

The embodiments disclosed herein relate to semiconductor structures and their manufacturing methods, and more particularly to methods and semiconductor structures including transistors with vertical channel layers wrapped around by different number of work function layers. Furthermore, the present embodiments provide one or more of the following advantages. The additional portions of the work function layers on top spacers and inner spacers are removed to increase the process window. The transistors with vertical channel layers wrapped around by different number of work function layers have the same footprint.

Thus, one of the embodiments of the present disclosure describes a method for manufacturing a semiconductor structure that includes forming a semiconductor layer over a substrate, patterning the semiconductor layer to form a first channel layer in a first region and a second channel layer in a second region, forming upper inner spacers over the first channel layer and the second channel layer, and forming first source/drain features over the first channel layer and the second channel layer. The method further includes forming a gate dielectric layer wrapping around the first channel layer and the second channel layer, and on sidewalls of the upper inner spacers, forming a first work function layer wrapping around the gate dielectric layer in both the first region and the second region, forming a first hard mask layer wrapping around the first work function layer, and removing portions of the hard mask layer and the first work function layer to expose the gate dielectric layer on the sidewalls of the upper inner spacers. The method further includes removing the hard mask layer and the first work function layer in the first region, removing the hard mask layer in the second region, forming a second work function layer wrapping around the first work function layer in the first region and the second channel layer in the second region, forming a metal material between the second work function layer, and forming second source/drain features under the first channel layer and the second channel layer. The second work function layer is in contact with the gate dielectric layer on the sidewalls of the upper inner spacers in both the first region and the second region.

In some embodiments, the method for manufacturing the semiconductor structure further includes forming lower inner spacers under the first channel layer and the second channel layer and forming the gate dielectric layer on sidewalls of the lower inner spacers.

In some embodiments, the method for manufacturing the semiconductor structure further includes forming an isolation structure between the lower inner spacers and forming the gate dielectric layer over the isolation structure.

In some embodiments, the method for manufacturing the semiconductor structure further includes removing portions of the gate dielectric layer over the isolation structure during the removal of the portions of the hard mask layer and the first work function layer, so that a thickness of the gate dielectric layer over the isolation structure is less than a thickness of the gate dielectric layer wrapping around the first channel layer and the second channel layer.

In some embodiments, the method for manufacturing the semiconductor structure further includes removing the gate dielectric layer over the isolation structure during the removal of the portions of the hard mask layer and the first work function layer.

In some embodiments, a thickness of the gate dielectric layer wrapping around the first channel layer and the second channel layer is in a range from about 1 nm to about 2.5 nm.

In some embodiments, the method for manufacturing the semiconductor structure further includes forming a glue layer on the second work function layer and forming the metal material inside the glue layer.

In some embodiments, the method for manufacturing the semiconductor structure further includes forming interfacial layers wrapping around the first channel layer and the second channel layer and forming the gate dielectric layer wrapping around the interfacial layers.

In some embodiments, the method for manufacturing the semiconductor structure further includes forming a dipole material wrapping around the gate electric layer, forming a second hard mask layer wrapping around the dipole material, removing portions of the second hard mask layer and the dipole material to expose the gate dielectric layer on the sidewalls of the upper inner spacers, removing the second hard mask layer and the dipole material wrapping around the first channel layer, removing the second hard mask layer wrapping around the second channel layer, annealing the dipole material wrapping around the second channel layer to form a dipole layer between the interfacial layer and the second channel layer, and removing the dipole material wrapping around the second channel layer.

In some embodiments, an anisotropic etching process is performed to remove the portions of the hard mask layer and the first work function layer.

In another of the embodiments, discussed is a method for manufacturing a semiconductor structure including forming channel layers over a substrate, forming lower inner spacers around bottom ends of the channel layers, forming first source/drain features over the channel layers, forming an isolation structure between the lower inner spacers, and forming a gate dielectric layer wrapping around the channel layers, on sidewalls of the lower inner spacers, and over the isolation structure. The method further includes forming a first work function layer wrapping around the gate dielectric layer, forming a hard mask layer wrapping around the first work function layer, and removing portions of the hard mask layer and the first work function layer directly over the isolation structure to expose the gate dielectric layer on the sidewalls of the lower inner spacers. The method further includes removing the hard mask layer and the first work function layer wrapping around a first channel layer of the channel layers, removing the hard mask layer wrapping around a second channel layer of the channel layers, forming a second work function layer wrapping around the first work function layer and the first channel layer, forming a metal material wrapping around the second work function layer, and forming second source/drain features under the channel layers. The second work function layer is in contact with the gate dielectric layer on the sidewalls of the lower inner spacer In some embodiments, the method for manufacturing the semiconductor structure further includes forming top spacers before the formation of the first source/drain features. The sidewalls of the first source/drain features are in contact with the top spacers.

In some embodiments, the method for manufacturing the semiconductor structure further includes forming upper inner spacers around top ends of the channel layers and trimming the channel layers to remove portions of the channel layers vertically between the upper inner spacers and the lower inner spacers.

In some embodiments, the first work function layer is vertically between the upper inner spacers and the lower inner spacers.

In some embodiments, the second work function layer is in contact with the isolation structure.

In some embodiments, the isolation structure has concave top surfaces.

In some embodiments, the method for manufacturing the semiconductor structure further includes forming a liner layer on the sidewalls of the lower inner spacers, forming a dielectric material inside the liner layer, and recessing the liner layer and the dielectric material to form the isolation structure.

In yet another of the embodiments, discussed is a semiconductor structure that includes a channel layer, an upper inner spacer, a lower inner spacer, a first source/drain feature, a second source/drain feature, a gate dielectric layer, a first work function layer, a second work function layer, and a metal material. The upper inner spacer is around a top end of the channel layer. The lower inner spacer is around a bottom end of the channel layer. The first source/drain feature is over the channel layer and the upper inner spacer. The second source/drain feature is under the channel layer and the lower inner spacer. The gate dielectric layer wraps around the channel layer. The gate dielectric layer includes an extending portion covering sidewalls of the upper inner spacers and the lower inner spacers. The first work function layer wraps around the channel layer. The second work function layer wraps around and is in contact with the first work function layer. The second work function layer further extends onto the sidewalls of the upper inner spacers and the lower inner spacers and is in contact with the extending portion of the gate dielectric layer. The metal material wraps around the second work function layer.

In some embodiments, the semiconductor structure further includes a top spacer over the upper inner spacer. The gate dielectric layer wraps around the top spacers in a top view.

In some embodiments, the semiconductor structure further includes an interfacial layer wrapping around the channel layer and a dipole layer wrapping around the interfacial layer. The gate dielectric layer wraps around the interfacial layer and the dipole layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
forming a semiconductor layer over a substrate;
patterning the semiconductor layer to form a first channel layer in a first region and a second channel layer in a second region;
forming upper inner spacers over the first channel layer and the second channel layer;
forming first source/drain features over the first channel layer and the second channel layer;
forming a gate dielectric layer wrapping around the first channel layer and the second channel layer, and on sidewalls of the upper inner spacers;
forming a first work function layer wrapping around the gate dielectric layer in both the first region and the second region;
forming a first hard mask layer wrapping around the first work function layer;
removing portions of the hard mask layer and the first work function layer to expose the gate dielectric layer on the sidewalls of the upper inner spacers;
removing the hard mask layer and the first work function layer in the first region;
removing the hard mask layer in the second region;
forming a second work function layer wrapping around the first work function layer in the first region and the second channel layer in the second region, wherein the second work function layer is in contact with the gate dielectric layer on the sidewalls of the upper inner spacers in both the first region and the second region;
forming a metal material between the second work function layer; and
forming second source/drain features under the first channel layer and the second channel layer.

2. The method for manufacturing the semiconductor structure as claimed in claim 1, further comprising:
forming lower inner spacers under the first channel layer and the second channel layer; and
forming the gate dielectric layer on sidewalls of the lower inner spacers.

3. The method for manufacturing the semiconductor structure as claimed in claim 2, further comprising:
forming an isolation structure between the lower inner spacers; and
forming the gate dielectric layer over the isolation structure.

4. The method for manufacturing the semiconductor structure as claimed in claim 3, further comprising:
removing portions of the gate dielectric layer over the isolation structure during the removal of the portions of the hard mask layer and the first work function layer, so that a thickness of the gate dielectric layer over the isolation structure is less than a thickness of the gate dielectric layer wrapping around the first channel layer and the second channel layer.

5. The method for manufacturing the semiconductor structure as claimed in claim 3, further comprising:
    removing the gate dielectric layer over the isolation structure during the removal of the portions of the hard mask layer and the first work function layer.

6. The method for manufacturing the semiconductor structure as claimed in claim 1, wherein a thickness of the gate dielectric layer wrapping around the first channel layer and the second channel layer is in a range from about 1 nm to about 2.5 nm.

7. The method for manufacturing the semiconductor structure as claimed in claim 1, further comprising:
    forming a glue layer on the second work function layer; and
    forming the metal material inside the glue layer.

8. The method for manufacturing the semiconductor structure as claimed in claim 1, further comprising:
    forming interfacial layers wrapping around the first channel layer and the second channel layer; and
    forming the gate dielectric layer wrapping around the interfacial layers.

9. The method for manufacturing the semiconductor structure as claimed in claim 8, further comprising:
    forming a dipole material wrapping around the gate electric layer;
    forming a second hard mask layer wrapping around the dipole material;
    removing portions of the second hard mask layer and the dipole material to expose the gate dielectric layer on the sidewalls of the upper inner spacers;
    removing the second hard mask layer and the dipole material wrapping around the first channel layer;
    removing the second hard mask layer wrapping around the second channel layer;
    annealing the dipole material wrapping around the second channel layer to form a dipole layer between the interfacial layer and the second channel layer; and
    removing the dipole material wrapping around the second channel layer.

10. The method for manufacturing the semiconductor structure as claimed in claim 1, wherein an anisotropic etching process is performed to remove the portions of the hard mask layer and the first work function layer.

11. A method for manufacturing a semiconductor structure, comprising:
    forming channel layers over a substrate;
    forming lower inner spacers around bottom ends of the channel layers;
    forming first source/drain features over the channel layers;
    forming an isolation structure between the lower inner spacers;
    forming a gate dielectric layer wrapping around the channel layers, on sidewalls of the lower inner spacers, and over the isolation structure;
    forming a first work function layer wrapping around the gate dielectric layer;
    forming a hard mask layer wrapping around the first work function layer;

removing portions of the hard mask layer and the first work function layer directly over the isolation structure to expose the gate dielectric layer on the sidewalls of the lower inner spacers;
    removing the hard mask layer and the first work function layer wrapping around a first channel layer of the channel layers;
    removing the hard mask layer wrapping around a second channel layer of the channel layers;
    forming a second work function layer wrapping around the first work function layer and the first channel layer, wherein the second work function layer is in contact with the gate dielectric layer on the sidewalls of the lower inner spacer;
    forming a metal material wrapping around the second work function layer; and
    forming second source/drain features under the channel layers.

12. The method for manufacturing the semiconductor structure as claimed in claim 1, further comprising:
    forming top spacers before the formation of the first source/drain features, wherein sidewalls of the first source/drain features are in contact with the top spacers.

13. The method for manufacturing the semiconductor structure as claimed in claim 12, further comprising:
    forming upper inner spacers around top ends of the channel layers; and
    trimming the channel layers to remove portions of the channel layers vertically between the upper inner spacers and the lower inner spacers.

14. The method for manufacturing the semiconductor structure as claimed in claim 13, wherein the first work function layer is vertically between the upper inner spacers and the lower inner spacers.

15. The method for manufacturing the semiconductor structure as claimed in claim 11, wherein the second work function layer is in contact with the isolation structure.

16. The method for manufacturing the semiconductor structure as claimed in claim 15, wherein the isolation structure has concave top surfaces.

17. The method for manufacturing the semiconductor structure as claimed in claim 11, further comprising:
    forming a liner layer on the sidewalls of the lower inner spacers;
    forming a dielectric material inside the liner layer; and
    recessing the liner layer and the dielectric material to form the isolation structure.

18. A semiconductor structure, comprising:
    a channel layer;
    an upper inner spacer around a top end of the channel layer;
    a lower inner spacer around a bottom end of the channel layer;
    a first source/drain feature over the channel layer and the upper inner spacer;
    a second source/drain feature under the channel layer and the lower inner spacer;
    a gate dielectric layer wrapping around the channel layer, wherein the gate dielectric layer comprises extending portions covering bottom surfaces and sidewalls of the upper inner spacers and top surfaces and sidewalls of the lower inner spacers;
    a first work function layer wrapping around the channel layer;
    a second work function layer wrapping around and in contact with the first work function layer, wherein the second work function layer further extends onto the sidewalls of the upper inner spacers and the lower inner spacers and is in contact with the extending portion of the gate dielectric layer; and a metal material wrapping around the second work function layer.

19. The semiconductor structure as claimed in claim 18, further comprising:

a top spacer over the upper inner spacer, wherein the gate dielectric layer wraps around the top spacers in a top view.

20. The semiconductor structure as claimed in claim 18, further comprising:

an interfacial layer wrapping around the channel layer; and a dipole layer wrapping around the interfacial layer, wherein the gate dielectric layer wraps around the interfacial layer and the dipole layer.

\* \* \* \* \*